United States Patent
Higuchi et al.

(10) Patent No.: US 10,451,184 B2
(45) Date of Patent: Oct. 22, 2019

(54) SLIDING MEMBER AND METHOD FOR PRODUCING SAME

(71) Applicant: NISSAN MOTOR CO., LTD., Yokohama-shi, Kanagawa (JP)

(72) Inventors: Tsuyoshi Higuchi, Kanagawa (JP); Yutaka Mabuchi, Kanagawa (JP); Hideaki Kamiyama, Ichinoseki (JP); Katsuaki Ogawa, Kawaguchi (JP)

(73) Assignee: NISSAN MOTOR CO., LTD., Yokohama-shi (JP)

( * ) Notice: Subject to any disclaimer, the term of this patent is extended or adjusted under 35 U.S.C. 154(b) by 246 days.

(21) Appl. No.: 15/672,849

(22) Filed: Aug. 9, 2017

(65) Prior Publication Data

US 2017/0335964 A1 Nov. 23, 2017

Related U.S. Application Data

(62) Division of application No. 14/763,011, filed as application No. PCT/JP2013/084212 on Dec. 20, 2013, now Pat. No. 9,759,323.

(30) Foreign Application Priority Data

Jan. 28, 2013 (JP) .................. 2013-013290

(51) Int. Cl.
```
C23C 28/04    (2006.01)
F16J 9/26     (2006.01)
C25D 5/50     (2006.01)
C25D 7/10     (2006.01)
C23C 28/00    (2006.01)
```
(Continued)

(52) U.S. Cl.
CPC .............. *F16J 9/26* (2013.01); *C23C 16/27* (2013.01); *C23C 28/32* (2013.01); *C23C 28/322* (2013.01); *C23C 28/343* (2013.01); *C23C 28/347* (2013.01); *C25D 3/04* (2013.01); *C25D 5/50* (2013.01); *C25D 7/10* (2013.01); *F16J 9/28* (2013.01)

(58) Field of Classification Search
USPC .............................. 427/249.1, 314, 404, 577
See application file for complete search history.

(56) References Cited

U.S. PATENT DOCUMENTS

| | | | |
|---|---|---|---|
| 7,458,585 B2 | 12/2008 | Hamada et al. | |
| 7,771,821 B2 | 8/2010 | Martin et al. | |
| 2005/0005892 A1 | 1/2005 | Nishimura et al. | |

FOREIGN PATENT DOCUMENTS

| | | |
|---|---|---|
| JP | 2004-043837 A | 2/2004 |
| JP | 2005-002888 A | 1/2005 |

(Continued)

*Primary Examiner* — Archene A Turner
(74) *Attorney, Agent, or Firm* — Foley & Lardner LLP

(57) ABSTRACT

A sliding member includes: a base; a chromium-based hard chromium plated layer formed on the surface of the base; a hard carbon layer that is mainly composed of carbon element and is formed on the hard chromium plated layer. The hydrogen concentration of the hard chromium plated layer is equal to or less than 150 mass ppm.

A method for producing the sliding member involves heating the surface of the base on which the chromium-based hard chromium plated layer has been formed at a temperature of 250° C. or more so that the hydrogen concentration of the hard chromium plated layer is equal to or less than 150 mass ppm, and thereafter forming the hard carbon layer mainly composed of carbon element on the hard chromium plated layer.

8 Claims, 8 Drawing Sheets

(51) Int. Cl.
*C23C 16/27* (2006.01)
*C25D 3/04* (2006.01)
*F16J 9/28* (2006.01)

(56) References Cited

FOREIGN PATENT DOCUMENTS

| | | |
|---|---|---|
| JP | 2005-003094 A | 1/2005 |
| JP | 2011-157610 A | 8/2011 |

SLIDING MEMBER AND METHOD FOR PRODUCING SAME

CROSS REFERENCE TO RELATED APPLICATIONS

This application is a divisional of U.S. application Ser. No. 14/763,011 filed on Jul. 23, 2015, which is the National Phase Application of PCT/JP2013/084212, filed on Dec. 20, 2013, which claims benefit of priority from the prior Japanese Application No. 2013-013290, filed on Jan. 28, 2013; the entire contents of all of which are incorporated herein by reference.

TECHNICAL FIELD

The present invention relates to a sliding member and a method for producing the same. In more detail, the present invention relates to a sliding member in which a predetermined hard chromium plated layer and a hard carbon layer are laminated on the surface of a base in the written order, and to a method for producing the same.

BACKGROUND ART

A piston ring for an automobile engine has been proposed, which has remarkably good low-friction property and can improve fuel-efficiency more than conventional combinations of an iron material and an organic molybdenum compound (see Patent Document 1).

The piston ring for an automobile engine is used for automobile engines that include a sliding member sliding in the presence of lubricating oil. The sliding surface of the sliding member is coated with a hard carbon film that contains hydrogen atoms in an amount of 25 at % or less. In the piston ring for an automobile engine, the hard carbon film has improved adhesion and improved durability, which are obtained by a pretreatment of chromium plating on the sliding surface of the sliding member prior to the hard carbon film coating.

CITATION LIST

Patent Literature

Patent Document 1: Japanese Patent Unexamined Publication No. 2005-2888

SUMMARY OF INVENTION

Technical Problem

However, as a result of a study of the present inventors, they found that a further improvement must be made even in the piston ring for an automobile engine described in Patent Document 1 with regard to the peeling resistance when it is subjected to high-speed sliding and a high load.

The present invention was made in view of the above-described problem with the prior art. It is an object of the present invention to provide a sliding member that has good peeling resistance and a method for producing the same.

Solution to Problem

The present inventors conducted a keen study in order to accomplish the above-described object. As a result, they found that the above-described object is accomplished by providing a predetermined hard chromium plated layer and a hard carbon layer that are laminated on the surface of a base in the written order. The present invention was thus completed.

That is, the sliding member of the present invention includes a base, a chromium-based hard chromium plated layer formed on the surface of the base, and a hard carbon layer that is mainly composed of carbon element and is formed on the hard chromium plated layer. In the sliding member of the present invention, the hydrogen concentration of the hard chromium plated layer is from 10 to 140 mass ppm.

The method for producing the sliding member of the present invention is one aspect of the methods for producing the sliding member of the present invention. In this aspect, the surface of the base, on which the chromium-based hard chromium plated layer has been formed, is heated at a temperature of from 260° C. to less than 400° C. so that the hydrogen concentration of the hard chromium plated layer is from 10 to 140 mass ppm. Thereafter, the hard carbon layer mainly composed of carbon element is formed on the hard chromium plated layer.

Advantageous Effects of Invention

According to the present invention, the sliding member includes: the base; the chromium-based hard chromium plated layer formed on the surface of the base; and the hard carbon layer that is mainly composed of carbon element and is formed on the hard chromium plated layer, wherein the hydrogen concentration of the hard chromium plated layer is from 10 to 140 mass ppm. This configuration allows providing the sliding member with good peeling resistance and the method for producing the same.

DESCRIPTION OF EMBODIMENTS

Figure 1:
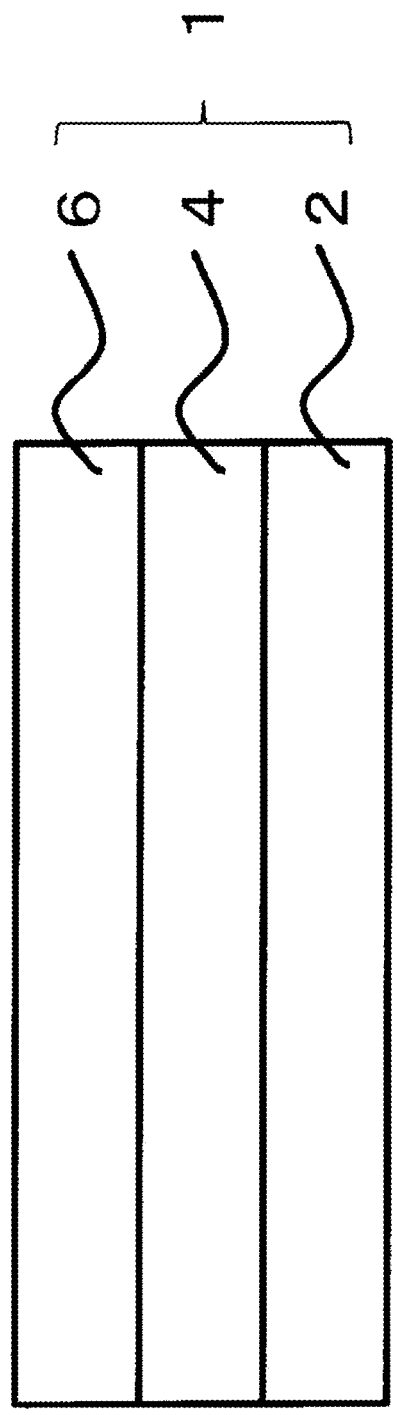
FIG. 1 is an explanatory view of a sliding member according to an embodiment of the present invention, illustrating the outline thereof.

Hereinafter, a sliding member according to an embodiment of the present invention and a method for producing the sliding member will be described in detail referring to the drawings. The dimension of the drawings referred to in the following description is exaggerated for descriptive reasons, and may be different from the actual dimension.

FIG. 1 is an explanatory view of the sliding member according to the embodiment of the present invention, illustrating the outline thereof. As illustrated in FIG. 1, the sliding member 1 of this embodiment includes: a base 2; a chromium-based hard chromium plated layer 4 formed on the surface of the base 2; and a hard carbon layer 6 that is mainly composed of carbon element and is formed on the hard chromium plated layer 4. In the present invention, the hydrogen concentration of the hard chromium plated layer 4 is equal to or less than 150 mass ppm.

Regarding a sliding member in which a hard chromium plated layer and a hard carbon layer are laminated on a base, the present inventors studied the peeling resistance of the hard carbon layer and found that the peeling resistance is largely dependent on the properties of the hard chromium plated layer, which severs as an undercoat.

That is, during a process of forming a hard carbon layer on a hard chromium plated layer, the hard chromium plated layer is exposed to a vacuum and/or high-temperature environment, and hydrogen present in the hard chromium plated layer is released as a gas. The released hydrogen then inhibits carbon deposition on the hard chromium plated layer. The present inventors found that this is a cause of the decreased adhesion between the hard chromium plated layer and the hard carbon layer.

After further advancing the study, they found that the adhesion between the hard chromium plated layer and the hard carbon layer is remarkably improved when the surface of the base with the chromium-based hard chromium plated layer formed thereon is heated at a temperature of 250° C. or more prior to forming the hard carbon layer so that the hydrogen concentration of the hard chromium plated layer is equal to or less than 150 mass ppm.

Figure 2:
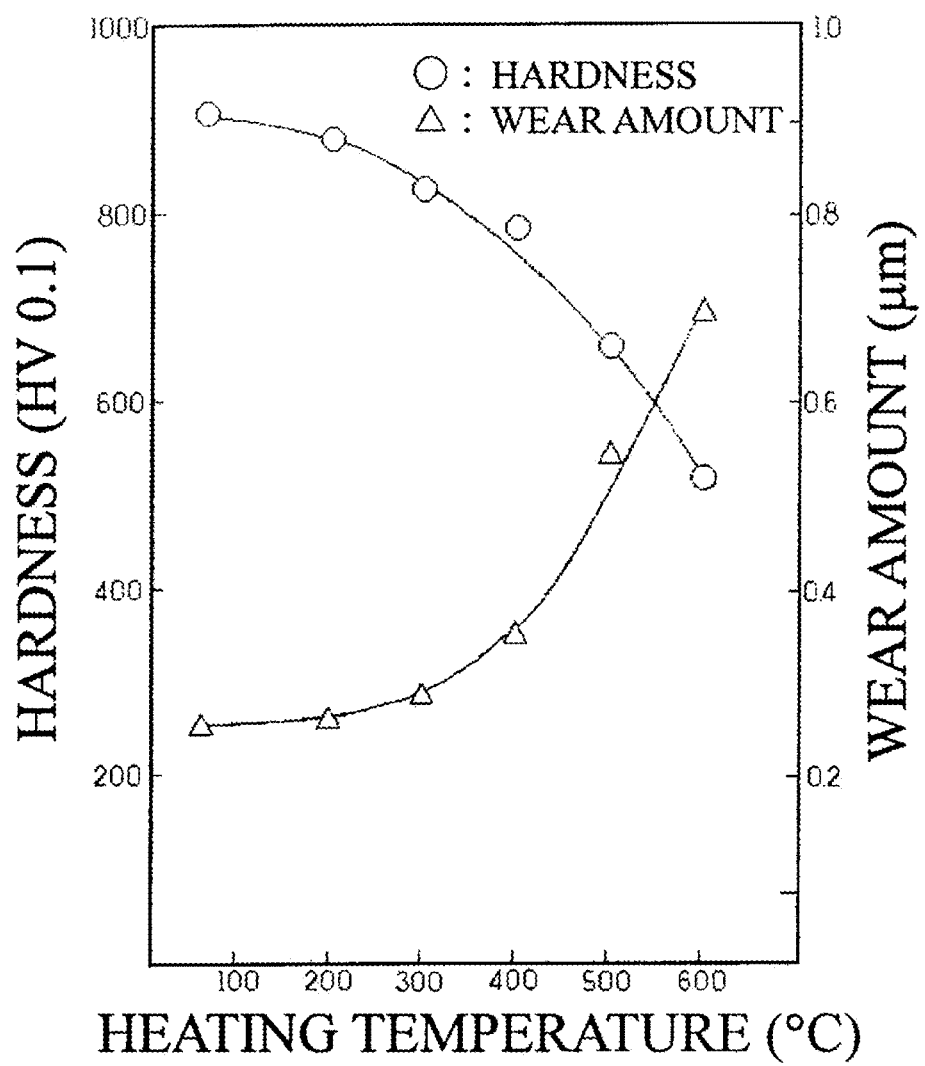
FIG. 2 is a graph illustrating the relationship between heating temperature and hardness or abrasion loss of a chromium plated layer.

Although the lower hydrogen concentration of the hard chromium plated layer is better, the hard chromium plated layer contains a lot of hydrogen at the time of formation. When the hydrogen is released by a heat treatment, a higher temperature can release more hydrogen. However, as is seen from the graph of FIG. 2, which illustrates the relationship between heating temperature and hardness or abrasion loss of the chromium plated layer, when the heating temperature is equal to or greater than 400° C., the hardness of the chromium plated layer is decreased, and the wear resistance of the chromium plated layer is decreased accordingly. Therefore, it is preferred that the heating temperature is less than 400° C.

Thank to the good peeling resistance, the sliding member of the present invention can be used either in the presence or absence (so-called dry condition) of a lubricant. However, since a base material (e.g. base oil) or an additive of a lubricant can be adsorbed on the surface of the hard carbon layer to decrease the friction to further prevent peeling, it is preferred that the sliding member is used in the presence of a lubricant (in a lubricant).

The sliding member may be a sliding member of a valve train, an intake and exhaust system or a power train of internal-combustion engines such as two- and four-stroke engines, in particular automobile engines. However, the present invention is not limited thereto but is also applicable to variable swash plates or rotating vanes of refrigerant compressors.

Examples of sliding members of a valve train or an intake and exhaust system include, for example, piston rings, piston pins, pistons (or piston skirts (a piston skirt means a skirt portion of a piston), cylinders (or cylinder liners), plungers, check valves, valve guides, connection rods, bushes, crank shafts, cum lobes, cum journals, locker arms, valve springs, shims, lifters, rotating vanes of vane pumps, housings of vane pumps, timing chains, sprockets, chain guides (or chain guide shoes), chain tensioners (or chain tensioner shoes) and the like.

Examples of sliding members of a power drive include, for example, gears, chains, belts, roller bearings, slide bearings, oil pumps etc. of automatic transmissions, continuously variable transmissions, manual transmissions, final drive gears, and the like.

Bases that can be used in the present invention include metal members such as high-purity iron members, aluminum members and titanium members. In addition, iron alloy members (e.g. stainless steel (steel)), copper alloy members, aluminum alloy members, magnesium alloy members and titanium alloy members may also be used. Furthermore, non-metal members such as resin members like rubber or plastic, ceramic members and carbon members may also be used. In particular, iron alloy members, aluminum alloy members and magnesium alloy members are preferred since they are readily applicable to sliding members of existing machines and apparatuses. Also, they can contribute to energy saving widely in various fields. Furthermore, it is also advantageous that such metal or non-metal members are coated with a variety of films. For example, iron alloy members, aluminum alloy member, magnesium alloy members, titanium alloy members and the like may be coated with a film of titanium nitride (TiN), chromium nitride (CrN) or the like.

Preferred iron alloy members that can be used include, for example, iron-based alloys containing nickel, copper, zinc, chromium, cobalt, molybdenum, lead, silicon, titanium or any combination thereof. For example, high-carbon chromium bearing steels (defined as SUJ2 in JIS G4805), alloy tool steels, blister steels, low-alloy chilled casted irons, heat-treated carbon steels, hardened steels and the like can be used. Specific examples include nickel-chromium steels (SNC415, SNC815), nickel-chromium-molybdenum steels (SNCM220, SNCM415, SNCM420, SNCM616, SNCM815), chromium steels (SCr415, SCr420), chromium-molybdenum steels (SCM415, SCM418, SCM420, SCM421, SCM822), manganese steels (SMn420), manganese-chromium steels (SMnC420) and the like. However, the iron alloy members are not limited thereto.

The surface hardness of such iron members and iron alloy members are preferably from HRC 45 to HRC 60 in Rockwell hardness (C scale). Such hardness is advantageous because the base can maintain the durability of the hard carbon layer even in a sliding condition of a high surface pressure of approximately 700 MPa, to which cum follower members are exposed for example. When the surface hardness is less than HRC 45, bucking and peeling may be more likely to be caused.

Further, in terms of the stability of sliding, it is preferred that the surface roughness of such iron members and iron alloy members is equal to or less than 0.1 μm in arithmetic average roughness Ra. If the surface roughness is greater than 0.1 μm, a local scuffing may be formed, causing a large increase in friction coefficient.

Preferred aluminum alloy members that can be used include, for example, hypoeutectic aluminum alloys or hypereutectic aluminum alloys containing from 4 mass % to 20 mass % of silicon (Si) and from 1.0 mass % to 5.0 mass % of copper (Cu). Specific examples include AC2A, AC8A, ADC12 and ADC14 defined in JIS and the like.

The surface hardness of such aluminum members and aluminum alloy members is preferably from HB 80 to HB 130 in Brinell hardness. If the surface hardness of aluminum members and aluminum alloy members is out of the above-described range, i.e. if it is less than HB 80, the aluminum members and aluminum alloy members may wear out more easily.

Further, the surface roughness of such aluminum members and aluminum alloy members are preferably equal to or less than 0.1 µm in arithmetic average roughness Ra in terms of the stability of sliding. If the surface roughness is greater than 0.1 µm, a local scuffing may be formed, causing a large increase in friction coefficient.

Preferred magnesium alloys that can be used include, for example, magnesium-aluminum-zinc (Mg—Al—Zn) alloys, magnesium-aluminum-rare earth metal (Mg—Al-REM) alloys, magnesium-aluminum-calcium (Mg—Al—Ca) alloys, magnesium-zinc-aluminum-calcium (Mg—Zn—Al—Ca) alloys, magnesium-aluminum-calcium-rare earth metal (Mg—Al—Ca-REM) alloys, magnesium-aluminum-strontium (Mg—Al—Sr) alloys, magnesium-aluminum-silicon (Mg—Al—Si) alloys, magnesium-rare earth metal-zinc (Mg-REM-Zn) alloys, magnesium-silver-rare earth metal (Mg—Ag-REM) alloys and magnesium-yttrium-rare earth metal (Mg—Y-REM) alloys, and any combination thereof. Specific examples are AZ91, AE42, AX51, AXJ, ZAX85, AXE522, AJ52, AS21, QE22 and WE43 defined in ASTM, and the like.

The surface hardness of such magnesium members and magnesium alloy members is preferably from HB 45 to HB 95 in Brinell hardness. If the surface hardness of such magnesium members and magnesium alloy members is out of the above-described range, i.e. if it is less than HB 45, the aluminum members or aluminum alloy members may wear out more easily.

Further, in terms of the stability of sliding, it is preferred that the surface roughness of such magnesium members and magnesium alloy members is equal to or less than 0.1 µm in arithmetic average roughness Ra. If the surface roughness is greater than 0.1 µm, a local scuffing may be formed, causing a large increase in friction coefficient.

The hard chromium plated layer of the present invention may be a chromium-based plated layer. As used herein, the term "chromium-based" means that the chromium content in a plated layer is equal to or greater than 50 mass %. The composition of the hard chromium plated layer is typically from 0.03 mass % to 0.1 mass % of hydrogen, from 0.2 mass % to 0.5 mass % of oxygen and the remaining part of chromium, which may slightly change depending on the type of a plating bath or electrodeposition conditions though. In the sliding member according to the present invention, the hydrogen concentration of the hard chromium plated layer is equal to or less than 150 mass ppm, to preferably from 10 mass ppm to 140 mass ppm, more preferably from 25 mass ppm to 110 mass ppm. When the hydrogen concentration is from 10 mass ppm to 140 mass ppm, it is preferred that the heating temperature is from 260° C. to less than 400° C. When the hydrogen concentration is from 25 mass ppm to 110 mass ppm, it is preferred that the heating temperature is from 290° C. to 360° C.

Hard carbon layers formed by chemical vapor deposition (CVD) or physical vapor deposition (PVD), which are described below, have high own internal stress compared to other surface treatments such as plating and thereby have remarkably high hardness. Accordingly, when a hard carbon layer is used in a sliding member of a mechanical component, it may peel off from the base or crack. However, the hard chromium plated layer, which is formed as an undercoat, can decrease the internal stress and thereby can make an improvement while maintaining the adhesion between the hard carbon layer and the base.

The surface hardness of the hard chromium plated layer is typically approximately from 800 to 1000 HV, preferably equal to or more than 700 HV, more preferably equal to or more than 750 HV, yet more preferably equal to or more than 800 HV in 10 g-load micro Vickers hardness.

Further, the thickness of the hard chromium plated layer is preferably from 0.05 to 200 µm, more preferably from 0.3 to 100 µm. When the thickness is less than 0.05 µm, the friction reducing effect may be lost in a while due to initial wear. Adversely, when the thickness is greater than 200 µm, the layer may peel off from the base due to the increased residual interlayer stress.

Hard carbon layers that can be used in the present invention include crystalline and non-crystalline layers mainly composed of carbon element. Such crystalline layers include layers of diamond. Such non-crystalline layers include layers having a carbon-carbon bonding geometry of both diamond structure ($SP^3$ bond) and graphite structure ($SP^2$ bond), layers mainly having the graphite structure ($SP^2$ bond), layers of so-called diamond-like carbon (DLC), and the like. Specific examples of the non-crystalline layers having a carbon-carbon bonding geometry of both diamond structure ($SP^3$ bond) and graphite structure ($SP^2$ bond) include amorphous carbon (a-C) layers consisting of carbon element (containing no hydrogen), hydrogen-amorphous carbon (a-C:H) layers containing hydrogen, metal amorphous carbon (MeC) layers containing a metal element such as titanium (Ti) or molybdenum (Mo) as a component, and the like. Further, tetrahedral amorphous carbon (ta-C) layers, which are non-crystalline layers having a carbon-carbon bonding geometry of mainly the diamond structure ($SP^3$ bond), can be also used.

The hard carbon layer is formed by CVD, PVD or the like. In general, hard carbon layers formed by CVD such as thermal CVD and plasma CVD contain hydrogen derived from an organic compound material (e.g. hydrocarbon gas). The hydrogen concentration in such hard carbon layers is typically from 15 at % to 40 at %. In contrast, inclusion or exclusion of hydrogen can be controlled in PVD such as ion plating using a carbon beam, arc ion plating, laser abrasion, sputtering and magnetron sputtering. The friction is reduced more as the hydrogen concentration of the hard carbon layer is lower. Accordingly, the hydrogen concentration of the hard carbon layer is preferably equal to or less than 40 at %, more preferably equal to or less than 25 at %, more preferably equal to or less than 10 at %, more preferably equal to or less than 5 at %, more preferably equal to or less than 2 at %, more preferably equal to or less than 0.3 at %, more preferably equal to or less than 0.1 at %. In particular, hydrogen amorphous carbon (a-C:H) containing hydrogen in an amount greater than 0 at % and less than or equal to 1 at %, amorphous carbon (a-C) containing no hydrogen and tetrahedral amorphous carbon (ta-C) containing no hydrogen are preferred. In terms of reducing hydrogen particularly in the outermost layer of the hard carbon layer, the hard carbon layer may have a multilayer structure composed of two or more layers, in which the outermost layer is made of hydrogen amorphous carbon (a-C:H) containing hydrogen in an amount greater than 0 at % and less than or equal to 1 at % or amorphous carbon (a-C) containing no hydrogen. As used herein, the term "outermost layer" represents the 5% from the outer surface of the hard carbon layer with respect to the total thickness thereof, typically the range from the outer surface to 1.0 µm in depth of the hard carbon layer. When the hard carbon layer has monolayer structure, the monolayer is referred to as the outermost layer.

Further, the surface roughness of the hard carbon layer is preferably equal to or less than 0.1 µm in arithmetic average roughness Ra, more preferably equal to or less than 0.08 µm, yet more preferably equal to or less than 0.05 µm, particularly equal to or less than 0.03 µm. When the surface roughness is greater than 0.1 µm in arithmetic average roughness Ra, local scuffing may be formed, causing an increase in friction coefficient. Since the smoother surface is better, the lower limit of the roughness is not particularly defined. However, in practice, the surface is finished to the above-described adequate roughness in consideration of the production cost. In terms of the stability of sliding, a suitable surface roughness is equal to or less than 0.08 µm in arithmetic average roughness Ra.

Next, lubricants used for the sliding member of the present invention will be described in detail.

Such lubricants include oxygen-containing organic compounds. The oxygen-containing organic compounds are not particularly limited and may be any organic compound that contains oxygen in the molecule. For example, such oxygen-containing organic compounds may be composed of carbon, hydrogen and oxygen, or may contain, in addition thereto, other elements such as nitrogen, sulfur, halogen (fluorine, chlorine, etc.), phosphor, boron and metal. In terms of further reducing the friction of the sliding surface between the hard carbon layer of the sliding member and the counterpart sliding member of an arbitrary material, suitable lubricants are oxygen-containing organic compounds that are composed of carbon, hydrogen and oxygen and have a hydroxyl group, and the derivatives thereof. It is more preferred that these compounds have two or more hydroxyl groups.

For the same reason, it is preferred that oxygen-containing organic compounds have low sulfur content or contain no sulfur.

As used herein, the term "derivative" typically refers to compounds that are obtained by reacting an oxygen-containing organic compound containing carbon, hydrogen and oxygen with, for example, a nitrogen-containing compound, a phosphor-containing compound, sulfur or a sulfur-containing compound, a boron-containing compound, halogen or a halogen-containing compound, metal or a metal-containing compound, or the like (regardless of an organic or inorganic compound), but is not particularly limited.

Specific examples of the oxygen-containing organic compounds include, for example, compounds having a hydroxyl group, a carboxyl group or a carbonyl group, compounds having an ester bond or an ether bond (these compounds may have two or more groups or bonds), and the like. It is preferred that the oxygen-containing organic compounds have one or more group or bond selected from hydroxyl, carboxyl, carbonyl and ester, more preferably one or more group or bond selected from hydroxyl, carboxyl and ester, yet more preferably one or more group selected from hydroxyl and carboxyl, particularly one or more hydroxyl group.

More specific examples include (1) alcohols, (2) carboxylic acids, (3) esters, (4) ethers, (5) ketones, (6) aldehydes and (7) carbonates (they may further have one or more group or bond selected from hydroxyl, carboxyl, carbonyl, ester and ether) and the derivatives thereof, and any combination thereof.

The alcohols (1) are oxygen-containing organic compounds of the following formula (I).

$$R\text{---}(OH)_n \tag{I}$$

For example, the alcohols (1) are compounds having one or more hydroxyl group.

Specific examples of the alcohols (1) include the following compounds:
monohydric alcohols (1-1),
dihydric alcohols (1-2),
tri- or more hydric alcohols (1-3),
alkylene oxide adducts of the above three alcohols (1-4), and
mixtures of one or more compound selected from the above four alcohols (1-5).

The monohydric alcohols (1-1), which have one hydroxyl group in the molecule, include, for example, monohydric alkyl alcohols of 1 to 40 carbons (the alkyl may be straight or branched) such as methanol, ethanol, propanol (1-propanol, 2-propanol), butanol (1-butanol, 2-butanol, 2-methyl-1-propanol, 2-methyl-2-propanol), pentanol (1-pentanol, 2-pentanol, 3-pentanol, 2-methyl-1-butanol, 3-methyl-1-butanol, 3-methyl-2-butanol, 2-methyl-2-butanol, 2,2-dimethyl-1-propanol), hexanol (1-hexanol, 2-hexanol, 3-hexanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 2,3-dimethyl-1-butanol, 2,3-dimethyl-2-butanol, 3,3-dimethyl-1-butanol, 3,3-dimethyl-2-butanol, 2-ethyl-1-butanol, 2,2-dimethylbutanol), heptanol (1-heptanol, 2-heptanol, 3-heptanol, 2-methyl-1-hexanol, 2-methyl-2-hexanol, 2-methyl-3-hexanol, 5-methyl-2-hexanol, 3-ethyl-3-pentanol, 2,2-dimethyl-3-pentanol, 2,3-dimethyl-3-pentanol, 2,4-dimethyl-3-pentanol, 4,4-dimethyl-2-pentanol, 3-methyl-1-hexanol, 4-methyl-1-hexanol, 5-methyl-1-hexanol, 2-ethylpentanol), octanol (1-octanol, 2-octanol, 3-octanol, 4-methyl-3-heptanol, 6-methyl-2-heptanol, 2-ethyl-1-hexanol, 2-propyl-1-pentanol, 2,4,4-trimethyl-1-pentanol, 3,5-dimethyl-1-hexanol, 2-methyl-1-heptanol, 2,2-dimethyl-1-hexanol), nonanol (1-nonanol, 2-nonanol, 3,5,5-trimethyl-1-hexanol, 2,6-dimethyl-4-heptanol, 3-ethyl-2,2-dimethyl-3-pentanol, 5-methyloctanol, etc.), decanol (1-decanol, 2-decanol, 4-decanol, 3,7-dimethyl-1-octanol, 2,4,6-trimethylheptanol, etc.), undecanol, dodecanol, tridecanol, tetradecanol, pentadecanol, hexadecanol, heptadecanol, octadecanol (stearyl alcohol, etc.), nonadecanol, eicosanol, heneicosanol, tricosanol and tetracosanol; monohydric alkenyl alcohols (the alkenyl may be straight or branched, and the double bond may be at any position) of 2 to 40 carbons such as ethenol, propenol, butenol, hexenol, octenol, decenol, dodecenol and octadecenol (oleyl alcohol, etc.); monohydric (alkyl) cycloalkyl alcohols of 3 to 40 carbons (the alkyl may be straight or branched, and the alkyl or hydroxyl substituent may be at any position) such as cyclopentanol, cyclohexanol, cycloheptanol, cyclooctanol, methylcyclopentanol, methylcyclohexanol, dimethylcyclohexanol, ethylcyclohexanol, propylcyclohexanol, butylcyclohexanol, dimethylcyclohexanol, cyclopentylmethanol, cyclohexylmethanol, cyclohexylethanol (1-cyclohexylethanol, 2-cyclohexylethanol, etc.), cyclohexylpropanol (3-cyclohexylpropanol, etc.), cyclohexylbutanol (4-cyclohexylbutanol, etc.), butylcyclohexanol and 3,3,5,5-tetramethylcyclohexanol; (alkyl)aryl alcohols (the alkyl may be straight or branched, and the alkyl or hydroxyl substituent may be at any position) such as phenylalcohol, methylphenylalcohol (o-cresol, m-cresol, p-cresol), creosol, ethylphenylalcohol, propylphenylalcohol, butylphenylalcohol, butylmethylphenylalcohol (3-methyl-6-tert-butylphenylalcohol, etc.), dimethylphenylalcohol, diethylphenylalcohol, dibutylphenylalcohol(2,6-ditert-butylphenylalcohol, 2,4-di-tert-butylphenyl alcohol, etc.), dibutylmethylphenylalcohol (2,6-di-tert-butyl-4-methylphenylalcohol, etc.), dibutylethylphenylalcohol (2,6-di-tert-butyl-4-ethylphenylalcohol, etc.), tributylphenylalcohol (2,4,6-tri-tert-butylphenylalcohol, etc.), naphthol (α-naphthol, β-naphthol, etc.) and dibutylnaphthol (2,4-di-tert-butyl-α-naphthol, etc.); 6-(4-oxy-3,5-di-tert-butyl-anilino)-2,4-bis-(n-octyl-thio)-1,3,5-triazine; the mixtures thereof; and the like.

Among these monohydric alcohols, straight or branched alkyl or alkenyl alcohols of 12 to 18 carbons such as oleylalcohol and stearylalcohol are preferably used since they can further reduce the friction of the sliding surface between the hard carbon layer of the sliding member and a counterpart sliding member of an arbitrary material and also has such a low volatility that they can reduce the friction even in a high-temperature condition (e.g. a sliding condition of an internal combustion engine).

The dihydric alcohols (1-2), which have two hydroxyl groups in the molecule, include, for example, alkyl- or alkenyldiols of 2 to 40 carbons (the alkyl or alkenyl moiety may be straight or branched, the double bond of the alkenyl moiety may be at any position, and the hydroxyl substituents may be at any position) such as ethylene glycol, diethylene glycol, polyethylene glycol, propylene glycol, dipropylene glycol, polypropylene glycol, neopentyl glycol, 1,3-propanediol, 1,4-butanediol, 1,2-butanediol, 2-methyl-1,3-propanediol, 1,5-pentanediol, 1,6-hexanediol, 2-ethyl-2-methyl-1,3-propanediol, 2-methyl-2,4-pentanediol, 1,7-heptanediol, 2-methyl-2-propyl-1,3-propanediol, 2,2-diethyl-1,3-propanediol, 1,8-octanediol, 1,9-nonanediol, 2-butyl-2-ethyl-1,3-propanediol, 1,10-decanediol, 1,11-undecanediol, 1,12-dodecanediol, 1,13-tridecanediol, 1,14-tetradecanediol, 1,15-pentadecanediol, 1,16-hexadecanediol, 1,17-heptadecanediol, 1,18-octadecanediol, 1,19-nonadecanediol, and 1,20-icosadecanediol; (alkyl) cycloalkanediols (the alkyl moiety may be straight or branched, and the alkyl or hydroxyl substituents may be at any position) such as cyclohexanediol and methylcyclohexanediol; dihydric (alkyl)aryl alcohols of 2 to 40 carbons (the alkyl moiety may be straight or branched, and the alkyl or hydroxyl substituents may be at any position) such as benzenediol (catechol, etc.), methylbenzenediol, ethylbenzenediol, butylbenzenediol (p-tert-buthylcatechol, etc.), dibutylbenzenediol (4,6-di-tert-butyl-resorcin, etc.), 4,4'-thiobis-(3-methyl-6-tert-butyl-phenol), 4,4'-butylidenebis-(3-methyl-6-tert-butyl-phenol), 2,2'-methylenebis-(4-methyl-6-tert-butyl-phenol), 2,2'-thiobis-(4,6-di-tert-butyl-resorcin), 2,2'-methylenebis (4-ethyl-6-tert-butyl-phenol), 4,4'-methylenebis-(2,6-di-tert-butyl-phenol), 2,2'-(3,5-di-tert-butyl-4-hydroxy)propane, and 4,4'-cyclohexilidenebis-(2,6-di-tert-butyl-phenol); a condensate of p-tert-butylphenol and formaldehyde, a condensate of p-tert-butylphenol and acetaldehyde; the mixtures thereof; and the like.

Among these dihydric alcohols, ethylene glycol, propylene glycol, neopentyl glycol, 1,4-butanediol, 1,5-pentanediol, neopentyl glycol, 1,6-hexanediol, 2-methyl-2,4-pentanediol, 2-ethyl-2-methyl-1,3-propanediol, 1,7-heptanediol, 1,8-octanediol, 1,9-nonanediol, 1,10-decanediol, 1,11-undecanediol, 1,12-dodecanediol, and the like are preferably used since they can further reduce the friction of the sliding surface between the hard carbon layer of the sliding member and a counterpart sliding member of an arbitrary material. Further, hindered alcohols having a high molecular weight of 300 or more, preferably 400 or more, such as 2,6-di-tert-butyl-4-(3,5-di-tert-butyl-4-hydroxy-benzyl)phenylalcohol, are preferred since they can reduce the friction even in a high-temperature condition (e.g. the sliding condition of internal combustion engines) due to its low volatility and high heat resistance in such conditions and can also impart good oxidation stability.

The tri- or more hydric alcohols (1-3), which have three or more hydroxyl groups, are polyhydric alcohols having typically 3 to 10 hydroxyl groups, preferably 3 to 6 hydroxyl groups. Specific examples include trimethylol alkanes such as glycerin, trimethylol ethane, trimethylol propane, and trimethylol butane; erythritol, pentaerythritol, 1,2,4-butanetriol, 1,3,5-pentanetriol, 1,2,6-hexanetriol, 1,2,3,4-butanetetrol, sorbitol, adonitol, arabitol, xylitol, mannitol and the like and the polymers and condensates thereof (e.g. dimer to octamer of glycerin such as diglycerin, triglycerin and tetraglycerin, dimer to octamer of trimethylol propane such as ditrimethylol propane, dimer to tetramer of pentaerythritol such as dipentaerythritol, condensates (intramolecular condensates, intermolecular condensates or self-condensates) such as sorbitan and sorbitol-glycerin condensate), and the like.

Further, sugars such as xylose, arabitol, ribose, rhamnose, glucose, fructose, galactose, mannose, sorbose, cellobiose, mantose, isomaltose, trehalose and sucrose can also be used.

Among these tri- or more hydric alcohols, tri- to hexa-hydric alcohols such as glycerin, trimethylol alkanes (e.g. trimethylol ethane, trimethylol propane, trimethylol butane), pentaerythritol, 1,2,4-butanetriol, 1,3,5-pentantriol, 1,2,6-hexanetriol, 1,2,3,4-butanetetrol, sorbitol, sorbitan, sorbitol-glycerin condensate, adonitol, arabitol, xylitol and mannitol, the mixtures thereof, and the like are more preferred. Glycerin, trimethylol ethane, trimethylol propane, pentaerythritol, sorbitan and the mixtures thereof are yet more preferred. Polyhydric alcohols that contains 20% or more, preferably 30% or more, particularly 40% or more of oxygen are particularly preferred. Polyalcohols having more than six hydroxyl groups have too high viscosity.

The alkylene oxide adducts (1-4) are alkylene oxide adducts of the above-described alcohols (1-1 to 1-3). Specifically, an alkylene oxide of 2 to 6 carbons, preferably 2 to 4 carbons, or a polymer or copolymer thereof is added to the alcohols so that the hydroxyl group thereof is converted to a hydrocarbylether or a hydrocarbylester. Such alkylene oxides of 2 to 6 carbons include ethylene oxide, propylene oxide, 1,2-epoxybutane (α-butyleneoxide), 2,3-epoxybutane (β-butyleneoxide), 1,2-epoxy-1-methylpropane, 1,2-epoxyheptane, 1,2-epoxyhexane and the like. Among them, ethylene oxide, propylene oxide, butylene oxide are preferred in terms of good low-friction property. Ethylene oxide and propylene oxide are more preferred.

When two or more alkylene oxides are used, polymerization between the oxyalkylene groups may be of any type, including random copolymerization and block copolymerization. Regarding the addition of an alkylene oxide to a polyhydric alcohol having two to six hydroxyl groups, the alkylene oxide may be added to either all of or part of the hydroxyl groups.

The carboxylic acids (2) are oxygen-containing organic compounds of the following formula (II).

$$R-(COOH)_n \hspace{2cm} (II)$$

For example, the carboxylic acids (2) are compounds having one or more carboxyl groups.

Specific examples of such carboxylic acids (2) include the following compounds:
aliphatic monocarboxylic acids (fatty acids) (2-1),
aliphatic polycarboxylic acids (2-2),
carbocyclic carboxylic acids (2-3), heterocyclic carboxylic acids (2-4), and
mixtures of two or more compounds selected from the above four carboxylic acids (2-5)

Specific examples of the aliphatic monocarboxylic acids (fatty acids) (2-1), which are aliphatic monocarboxylic acids having one carboxyl group in the molecule, include, for example, saturated aliphatic monocarboxylic acids of 1 to 40 carbons (the saturated aliphatic moiety may be either straight or branched) such as methanoic acid, ethanoic acid (acetic acid), propaonic acid (propionic acid), butenoic acid (butyric acid, isobutyric acid, etc.), pentanoic acid (valeric acid, isovaleric acid, pivalic acid, etc.), hexanoic acid (caproric acid, etc.), heptanoic acid, octanoic acid (caprylic acid, etc.), nonanoic acid (pelargonic acid, etc.), decanoic acid, undecanoic acid, dodecanoic acid (lauric acid, etc.), tridecenoic acid, tetradecenoic acid (myristic acid, etc.), pentadecanoic acid, hexadecanoic acid (palmitic acid), heptadecanoic acid, octadecanoic acid (stearic acid), nonadecanoic acid, icosanoic acid, henicosanoic acid, docosanoic acid, tricosanoic acid, tetracosanoic acid, pentacosanoic acid, hexacosanoic acid, heptacosanoic acid, octacosanoic acid, nonacosanoic acid and triacontanoic acid; unsaturated aliphatic monocarboxylic acid of 1 to 40 carbons (the unsaturated aliphatic moiety may be either straight or branched, and the unsaturated bond may be at any position) such as propenoic acid (acrylic acid, etc.), propinoic acid (propiolic acid, etc.), butenoic acid (methacrylic acid, crotonic acid, isocrotonic acid, etc.), pentenoic acid, hexenoic acid, heptenoic acid, octenoic acid, nonenoic acid, decenoic acid, undecenoic acid, dodecenoic acid, tridecenoic acid, tetradecenoic acid, pentadecanoic acid, hex adecenoic acid, heptadecenoic acid, octadecenoic acid (oleic acid, etc.), nonadecenoic acid, icosenoic acid, heneicosenoic acid, docosenoic acid, tricosenoic acid, tetracosenoic acid, pentacosenoic acid, hexacosenoic acid, heptacosenoic acid, octacosenoic acid, nonacosenoic acid and triacontenoic acid; and the like.

Examples of the aliphatic polycarboxylic acids (2-2) include saturated or unsaturated aliphatic dicarboxylic acids of 2 to 40 carbons (the saturated or unsaturated aliphatic moiety may be either straight or branched, and the unsaturated bond may be at any position) such as ethandioic acid (oxalic acid, etc.), propanedionic acid (malonic acid, etc.), butanedioic acid (succinic acid, methylmalonic acid, etc.), pentanedioic acid (glutaric acid, ethylmalonic acid, etc.), hexanedioic acid (adipic acid, etc.), heptanedioic acid (pimelic acid, etc.), octanedioic acid (suberic acid, etc.), nonanedioic acid (azelaic acid, etc.), decanedioic acid (sebacic acid), propenedioic acid, butenedioic acid (maleic acid, fumaric acid, etc.), pentenedioic acid (citraconic acid, mesaconic acid, etc.), hexenedioic acid, heptenedioic acid, octenedioic acid, nonenedioic acid and decenedioic acid; saturated or unsaturated aliphatic tricarboxylic acids (the saturated or unsaturated aliphatic moiety may be either straight or branched, and the unsaturated bond may be at any position) such as propanetricarboxylic acid, butanetricarboxylic acid, pentanetricarboxylic acid, hexanetricarboxylic acid, heptanetricarboxylic acid, octanetricarboxylic acid, nonanetricarboxylic acid and decanetricarboxylic acid; saturated or unsaturated aliphatic tetracarboxylic acids (the saturated or unsaturated aliphatic moiety may be either straight or branched, and the unsaturated bond may be at any position); and the like.

Specific examples of the carbocyclic carboxylic acids (2-3), which are carboxylic acids having one or more carboxyl group on a carbon ring in the molecule, include, for example, mono-, di-, tri- or tetracarboxylic acids of 3 to 40 carbons having a naphthene ring (the alkyl or alkenyl substituent (if any) may be either straight or branched, the double bond may be at any position, and the number and position of the substituent are not limited) such as cyclohexanemonocarboxylic acid, methylcyclohexanemonocarboxylic acid, ethylcyclohexanemonocarboxylic acid, propylcyclohexanemonocarboxylic acid, butylcyclohexanemonocarboxylic acid, pentylcyclohexanemonocarboxylic acid, hexylcyclohexanemonocarboxylic acid, heptylcyclohexanemonocarboxylic acid, octylcyclohexanemonocarboxylic acid, cycloheptanemonocarboxylic acid, cyclooctanemonocarboxylic acid and trimethylcyclopentanedicarboxylic acid (camphor acid, etc.); aromatic monocarboxylic acid of 7 to 40 carbons such as benzenecarboxylic acid (benzoic acid), methylbenzenecarboxylic acid (toluic acid, etc.), ethylbenzenecarboxylic acid, propylbenzencarboxylic acid, benzenedicarboxylic acid (phthalic acid, isophthalic acid, telephthalic acid, etc.), benzenetricarboxylic acid (trimellitic acid, etc.), benzenetetracarboxylic acid (pyromellitic acid, etc.) and naphthalenecarboxylic acid (naphthoic acid); mono-, di-, tri- or tetracarboxylic acids of 7 to 40 carbons having an aryl group (the alkyl or alkenyl substituent (if any) may be either straight or branched, the double bond may be at any position, and the number and position of the substituent are not limited) such as phenylpropanoic acid, (hydroatropic acid), phenylpropenoic acid (atropic acid, cinnamic acid, etc.), salicylic acid and alkyl salicylic acids having one or more alkyl group of 1 to 30 carbons; and the like.

Specific examples of the heterocyclic carboxylic acids (2-4), which are heterocyclic carboxylic acids having one or more carboxyl group in the molecule, include, for example, heterocyclic carboxylic acids of 5 to 40 carbons such as furancarboxylic acid, thiophenecarboxylic acid and pyridinecarboxylic acid (nicotinic acid, isonicotinic acid, etc.), and the like.

The esters (3) are oxygen-containing organic compounds of the following formula (III).

$$R-(COO-R')_n \qquad (III)$$

For example, the esters (3) are compounds having one or more ester bond.

Specific examples of the esters (3) include the following compounds:
esters of aliphatic monocarboxylic acids (fatty acids) (3-1),
esters of aliphatic polycarboxylic acids (3-2),
esters of carbocyclic carboxylic acids (3-3),
esters of heterocyclic carboxylic acids (3-4),
alkylene oxide adducts of alcohols or esters (3-5), and
any mixture of compounds selected from the above five esters (3-6).

The above esters 3-1 to 3-5 may be either complete esters, in which all of the hydroxyl or carboxyl group is esterified, or partial esters, in which the hydroxyl or carboxyl group partly remains.

The esters of aliphatic monocarboxylic acids (fatty acids) (3-1) are esters of one or more of the above-described aliphatic monocarboxylic acids (2-1) and one or more of the above-described mono- di-, tri- or more hydric alcohols (1-1 to 1-3). Specific examples of such aliphatic monocarboxylic acids include, for example, glycerin monooleate, glycerin dioleate, sorbitan monooleate, sorbitan dioleate and the like. Among them, fatty acid esters having a straight or branched hydrocarbon group of 6 to 30 carbons, specifically esters of fatty acids having such a hydrocarbon group and aliphatic mono- or polyhydric alcohols are particularly preferred. Details are described below.

Examples of the esters (3-1) include, except for particularly preferred fatty acid ester type ash-free friction adjusters, aliphatic esters having a straight or branched hydrocarbon group of 1 to 5 carbons or 31 to 40 carbons, specifically esters of fatty acids having such a hydrocarbon group and aliphatic mono- or polyhydric alcohols.

Among them, esters having a kinetic viscosity at 100° C. of from 1 to 100 mm$^2$/s can be used as lubricant base oil, which are generally distinguishable from the particularly preferred fatty acid ester type ash-free friction adjusters. Examples of such esters include, for example, single esters and polyol esters (e.g. complex esters, etc.) of tri- or more hydric polyols, particularly tri- or more hydric polyols having a neopentyl structure, of 3 to 40 carbons, preferably 4 to 18 carbons, particularly 4 to 12 carbons (e.g. trimethylolpropane caprilate, trimethylolpropane pelargonate, pentaerythritol 2-ethylhexanoate, pentaerythritol pelargonate, etc.) and one or more acid selected from monocarboxylic acids of 1 to 40 carbons, preferably 4 to 18 carbons, particularly 6 to 12 carbons; mixtures thereat alkylene oxide adducts thereof; and the like. They may be either complete esters, in which all of the hydroxyl or carboxyl group is esterified, or partial esters, in which the hydroxyl or carboxyl group partly remain, but are preferably complete esters. The hydroxyl value is typically equal to or less than 100 mgKOH/g, more preferably equal to or less than 50 mgKOH/g, particularly equal to or less than 10 mgKOH/g. Further, the kinetic viscosity at 100° C. of such lubricant base oil is preferably 2 to 60 mm$^2$/s, particularly 3 to 50 mm$^2$/s.

The esters of aliphatic polycarboxylic acids (3-2) are esters of one or more selected from the above-described aliphatic polycarboxylic acids (2-2) and one or more selected from the above-described mono-, di-, tri- or more hydric alcohols (1-1 to 1-3), and the like. Specific examples include, for example, diesters of one or more polycarboxylic acid selected from dicarboxylic acids of 2 to 40 carbons, preferably 4 to 18 carbons, particularly 6 to 12 carbons and one or more alcohol selected from monohydric alcohols of 4 to 40 carbons, preferably 4 to 18 carbons, particularly 6 to 14 carbons, such as dibutyl maleate, ditridecyl glutarate, di-2-ethylhexyl adipate, diisodecyl adipate, ditridecyl adipate and di-2-ethylhexyl sabacate; copolymers of such a diester (e.g. dibutyl maleate, etc.) and a poly α-olefin of 4 to 16 carbons or the like; esters of an α-olefin adduct of acetic acid anhydride or the like and an alcohol of 1 to 40 carbons; and the like. Among them, esters having a is kinetic viscosity at 100° C. of from 1 to 100 mm$^2$/s can be used as lubricant base oil.

Examples of the esters of carbocyclic carboxylic acids (3-3) include esters of one or more acid selected from the above-described carbocyclic carboxylic acids (2-3) and one or more alcohol selected from the above-described mono-, di-, tri- or more hydric alcohols (1-1 to 1-3), and the like. Specific examples include, for example, aromatic carboxylates such as phthalates, trimellitates, pyromellitates, salicylates. Among them, esters having a kinetic viscosity at 100° C. of from 1 to 100 mm$^2$/s can be used as lubricant base oil.

Examples of the esters of heterocyclic carboxylic acids (3-4) include esters of one or more acid selected from the above-described heterocyclic carboxylic acids (2-4) and one or more alcohol selected from the above-described mono-, di-, tri- or more hydric alcohols (1-1 to 1-3). Among them, esters having a kinetic viscosity at 100° C. of from 1 to 100 mm$^2$/s can be used as lubricant base oil.

Examples of the alkylene oxide adducts of alcohols and esters (3-5) include esterified products obtained by adding an alkylene oxide to one or more alcohol selected from the above-described mono-, di-, tri- or more hydric alcohols (1-1 to 1-3), alkylene oxide adducts of the above-described esters (3-1 to 3-4), and the like. Among them, adducts having a kinetic viscosity at 100° C. of from 1 to 100 mm$^2$/s can be used as lubricant base oil.

The ethers (4) are oxygen-containing compounds of the following formula (IV).

$$R\text{—}(O\text{—}R')_n \qquad (IV)$$

For example, the ethers (4) are compounds having one or more ether bond.

Specific examples of the ethers (4) include, for example, the following compounds:
saturated or unsaturated aliphatic ethers (4-1),
aromatic ethers (4-2),
cyclic ethers (4-3), and
mixtures of two or more ethers selected from the above-described three ethers (4-4).

Specific examples of the saturated or unsaturated aliphatic ethers (aliphatic simple ethers) (4-1) include, for example, saturated or unsaturated aliphatic ethers of 1 to 40 carbons (the saturated or unsaturated aliphatic moiety may be either straight or branched, and the unsaturated bond may be at any position) such as dimethyl ether, diethyl ether, di-n-propyl ether, diisopropyl ether, dibutyl ether, diisobutyl ether, di-n-amyl ether, diisoamyl ether, dihexyl ether, diheptyl ether, dioctyl ether, dinonyl ether, didecyl ether, diundecyl ether, didodecyl ether, ditridecyl ether, ditetradecyl ether, dipentadecyl ether, dihexadecyl ether, diheptadecyl ether, diootadecyl ether, dinonadecyl ether, diicosyl ether, methylethyl ether, methyl-n-propyl ether, methylisopropyl ether, methylisobutyl ether, methyl-tert-butyl ether, methyl-n-amyl ether, methylisoamyl ether, ethyl-n-propyl ether, ethylisopropyl ether, ethylisobutyl ether, ethyl-tert-butyl ether, ethyl-n-amyl ether, ethylisoamyl ether, divinyl ether, diallyl ether, methylvinyl ether, methylallyl ether, ethylvinyl ether and ethylallyl ether.

Specific examples of the aromatic ethers (4-2) include, for example, anisole, phenetole, phenyl ether, benzyl ether, phenylbenzyl ether, α-naphthyl ether, β-naphthyl ether, polyphenyl ether, perfluoro ether and the like. They may have a saturated or unsaturated aliphatic group (the saturated or unsaturated aliphatic group may be either straight or branched, the unsaturated bond may be at any position, and the position and number of the substituent are not limited). They are preferably in the form of liquid in their conditions in use, particularly at ordinary temperature.

Specific examples of the cyclic ethers (4-3) include, for example, cyclic ethers of 2 to 40 carbons such as ethylene oxide, propylene oxide, trimethylene oxide, tetrahydropyran, tetrahydropyran, dioxane and glycidyl ether. They may have a saturated or unsaturated aliphatic group, a carbocyclic group or a carbocyclic group having a saturated or unsaturated aliphatic group (the saturated or unsaturated aliphatic group may be either straight or branched, the unsaturated bond may be at any position, and the position and number of the substituent are not limited).

The ketones (5) are oxygen-containing organic compounds of the following formula (V).

$$R\text{—}(CO\text{—}R')_n \qquad (V)$$

For example, the ketones (5) are compounds having one or more carbonyl bond.

Specific examples of the ketones (5) include, for example, the following compounds:
- saturated or unsaturated aliphatic ketones (5-1),
- carbocyclic ketones (5-2),
- heterocyclic ketones (5-3),
- ketone alcohols (5-4),
- ketone acids (5-5), and
- mixtures of two or more ketones selected from the above five ketones (5-6).

Specific examples of the saturated or unsaturated aliphatic ketones (5-1) include, for example, saturated or unsaturated aliphatic ketones of 1 to 40 carbons (the saturated or unsaturated aliphatic moiety may be either straight or branched, and the unsaturated bond may be at any position) such as acetone, methylethyl ketone, methylpropyl ketone, methylisopropyl ketone, methylbutyl ketone, methylisobutyl ketone, pinacolone, diethyl ketone, butylone, diisopropyl ketone, methylvinyl ketone, mesityl oxide and methylheptenone; and the like.

Specific examples of the carbocyclic ketones (5-2) include, for example, carbocyclic ketones of 1 to 40 carbons such as cyclobutanone, cyclopentanone, cyclohexanone, acetophenone, propiophenone, butyrophenone, valerophenone, benzophenone, dibenzyl ketone and 2-acetonaphthone. They may have a saturated or unsaturated aliphatic group (the saturated or unsaturated aliphatic group may be either straight or branched, the unsaturated bond may be at any position, and the position and number of the substituent are not limited.).

Specific examples of the heterocyclic ketones (5-3) include, for example, heterocyclic ketones of 1 to 40 carbons such as acetothienone and 2-acetofurone. They may have a saturated or unsaturated aliphatic group (the saturated or unsaturated aliphatic group may be either straight or branched, the unsaturated bond may be at any position, and the position and number of the substituent are not limited).

Specific examples of the ketone alcohols (ketols) (5-4) include, for example, ketone alcohols of 1 to 40 carbons such as acetol, acetoin, acetoethylalcohol, diacetone alcohol, phenacyl alcohol and benzoin. They may have a carbocyclic or heterocyclic ring, or a carbocyclic or heterocyclic ring having a saturated or unsaturated aliphatic group (the saturated or unsaturated aliphatic group may be either straight or branched, the unsaturated bond may be at any position, and the position and number of the substituent are not limited.).

Specific examples of the ketone acids (5-5) include, for example, ketone acids of 1 to 40 carbons such as α-ketone acids (pyruvic acid, benzoylformic acid, phenylpyruvic acid, etc.), β-ketone acids (acetoacetic acid, propionylacetic acid, benzoylacetic acid, etc.) and γ-ketone acids (e.g. levulinic acid, β-benzoylpropionic acid, etc.).

The aldehydes (6) are oxygen-containing organic compounds of the following formula (VI).

R—(CHO)$_n$ (VI)

For example, the aldehydes (6) are compounds having one or more aldehyde group.

Specific examples of the aldehydes (6) include the following compounds:
- saturated or unsaturated aliphatic aldehydes (6-1),
- carbocyclic aldehydes (6-2),
- heterocyclic aldehydes (6-3), and
- mixtures of two or more aldehydes selected from the above three aldehydes (6-4).

Specific examples of the saturated or unsaturated aliphatic aldehydes (6-1) include, for example, saturated or unsaturated aliphatic aldehydes of 1 to 40 carbons (the saturated or unsaturated aliphatic moiety may be either straight or branched, and the unsaturated bond may be at any position) such as formaldehyde, acetaldehyde, propionaldehyde, butylaldehyde, isobutylaldehyde, valeraldehyde, isovaleraldehyde, pivalinaldehyde, capronaldehyde, heptoaldehyde, caprylaldehyde, pelargonaldehyde, caprinaldehyde, undecylaldehyde, laurinaldehyde, tridecyl aldehyde, myristinaldehyde, pentadecylaldehyde, palmitinaldehyde, margarinaldehyde, stearinaldehyde, acrolein, crotonaldehyde, propyolaldehyde, glyoxal and succindialdehyde, and the like.

Specific examples of the carbocyclic aldehydes (6-2) include, for example, carbocyclic aldehydes of 1 to 40 carbons such as benzaldehyde, o-tolualdehyde, m-tolualdehyde, p-tolualdehyde, salicylaldehyde, cinnamaldehyde, α-naphthaldehyde and β-naphthaldehyde, and the like. They may have a saturated or unsaturated aliphatic group (the saturated or unsaturated aliphatic moiety may be either straight or branched, the unsaturated bond may be at any position, and the position and number of the substituent are not limited).

Further, specific examples of the heterocyclic aldehydes (6-3) include, for example, heterocyclic aldehydes of 1 to 40 carbons such as furfural, and the like. They may have a saturated or unsaturated aliphatic group (the saturated or unsaturated aliphatic moiety may be either straight or branched, the unsaturated bond may be at any position, and the position and number of the substituent are not limited).

The carbonates (7) are oxygen-containing organic compounds of the following formula (VII).

R—(O—COO—R')$_n$ (VII)

For example, the carbonates (7) are compounds having one or more carbonate bond.

Specific examples of the carbonates (7) include, for example, carbonates of 1 to 40 carbons having a saturated or unsaturated aliphatic group, a carbocyclic ring, a carbocyclic ring with a saturated or unsaturated aliphatic group, a saturated or unsaturated aliphatic group with a carbocyclic ring or the like (the saturated or unsaturated aliphatic moiety may be either straight or branched, the unsaturated bond may be at any position, and the position and number of the substituent are not limited), such as dimethyl carbonate, diethyl carbonate, di-n-propyl carbonate, diisopropyl carbonate, di-n-butyl carbonate, diisobutyl carbonate, di-tert-butyl carbonate, dipentyl carbonate, dihexyl carbonate, diheptyl carbonate, dioctyl carbonate, dinonyl carbonate, didecyl carbonate, diundecyl carbonate, didodecyl carbonate, ditridecyl carbonate, ditetradecyl carbonate, dipentadecyl carbonate, dihexadecyl carbonate, diheptadecyl carbonate, dioctadecyl carbonate and diphenyl carbonate; hydroxy (poly)oxyalkylene carbonates obtained by adding an alkylene oxide to these carbonates; and the like.

Examples of derivatives of the oxygen-containing organic compounds (1) to (7) include, for example, compounds obtained by reacting the above-described oxygen-containing organic compounds with a nitrogen-containing compound, a phosphor-containing compound, element sulfur or a sulfur-containing compound, a boron-containing compound, element halogen or a halogen-containing compound, or metal or a metal-containing compound (regardless of an organic or inorganic compound), but are not limited thereto. The above-described compounds used for obtaining a derivative are generally used as an additive, but the advantageous effects thereof are not limited even when they are used as base oil.

In the formulae (I) to (VII), R and R' are each independently a hydrocarbon group such as alkyl, alkenyl, alkylene, cycloalkyl, alkylcycloalkyl, aryl, alkylaryl and arylalkyl (these hydrocarbon groups may further have one or more group or bond selected from hydroxyl group, carboxyl group, carbonyl group, ester bond and ether bond, and may also has an element other than carbon, hydrogen and oxygen, such as nitrogen, sulfur (e.g. a heterocyclic compound), halogen (fluorine, chlorine, etc.), phosphor, boron and metal). The carbon number of these hydrocarbon groups is not particularly limited, but is preferably from 1 to 40, more preferably from 2 to 30, particularly from 3 to 20.

Examples of the alkyl group include alkyl groups of 1 to 40 carbons such as methyl, ethyl, n-propyl, isopropyl, n-butyl, isobutyl, sec-butyl, tert-butyl, straight or branched pentyl, straight or branched hexyl, straight or branched heptyl, straight or branched octyl, straight or branched nonyl, straight or branched decyl, straight or branched undecyl, straight or branched dodecyl, straight or branched tridecyl, straight or branched tetradecyl, straight or branched pentadecyl, straight or branched hexadecyl, straight or branched heptadecyl, straight or branched octadecyl, straight or branched nonadecyl, straight or branched icosyl, straight or branched henicosyl, straight or branched docosyl, straight or branched tricosyl and straight or branched tetracosyl. Preferred are alkyl groups of 2 to 30 carbons, particularly alkyl groups of 3 to 20 carbons.

Examples of the alkenyl group include alkenyl groups of 2 to 40 carbons such as vinyl group, straight or branched propenyl, straight or branched butenyl, straight or branched pentenyl, straight or branched hexenyl, straight or branched heptenyl, straight or branched octenyl, straight or branched nonenyl, straight or branched decenyl, straight or branched undecenyl, straight or branched dodecenyl, straight or branched tridecenyl, straight or branched tetradecenyl, straight or branched pentadecenyl, straight or branched hexadecenyl, straight or branched heptadecenyl, straight or branched octadecenyl, straight or branched nonadecenyl, straight or branched icosenyl, straight or branched heneicosenyl, straight or branched docosenyl, straight or branched tricosenyl and straight or branched tetracosenyl. Preferred are alkenyl groups of 2 to 30 carbons, particularly alkenyl groups of 3 to 20 carbons.

Examples of the cycloalkyl group include cycloalkyl groups of 3 to 40 carbons such as cyclopentyl, cyclohexyl, cycloheptyl and cyclooctyl. Preferred are cycloalkyl groups of 3 to 20 carbons, particularly cycloalkyl groups of 5 to 8 carbons.

Examples of the alkylcycloalkyl group include alkylcycloalkyl groups of 4 to 40 carbons such as methylcyclopentyl, dimethylcyclopentyl (including all structural isomers), methylethylcyclopentyl (including all structural isomers), diethylcyclopentyl (including all structural isomers), methylcyclohexyl, dimethylcyclohexyl (including all structural isomers), methylethylcyclohexyl (including all structural isomers), diethylcyclohexyl (including all structural isomers), methylcycloheptyl, dimethylcycloheptyl (including all structural isomers), methylethylcycloheptyl (including all structural isomers) and diethylcycloheptyl (including all structural isomers). Preferred are alkylcycloalkyl groups of 5 to 20 carbons, particularly alkylcycloalkyl groups of 6 to 12 carbons.

Examples of the aryl group include a phenyl group, a naphthyl group, aryl groups of 6 to 20 carbons. Preferred are aryl groups of 6 to 10 carbons.

Examples of the alkylaryl group include monosubstituted phenyl groups such as a tolyl (including all structural isomers), ethylphenyl (including all structural isomers), straight or branched propylphenyl (including all structural isomers), straight or branched butylphenyl (including all structural isomers), straight or branched pentylphenyl (including all structural isomers), straight or branched hexylphenyl (including all structural isomers), straight or branched heptylphenyl (including all structural isomers), straight or branched octylphenyl (including all structural isomers), straight or branched nonylphenyl (including all structural isomers), straight or branched decylphenyl (including all structural isomers), straight or branched undecylphenyl (including all structural isomers) and straight or branched dodecylphenyl (including all structural isomers); aryl groups having the same or different two or more straight or branched alkyl groups (the alkyl groups may further have an aryl group, an alkylaryl group or an arylalkyl group and includes all structural isomers) such as xylyl (including all structural isomers), diethylphenyl, dipropylphenyl, 2-methyl-6-tert-butylphenyl, 2,6-di-tert-butyl-4-methylphenyl and 2,6-di-tert-butyl-4-(3,5-di-tert-butyl-4-benzyl)phenyl; and the like. The alkylaryl group is an alkylaryl group of 7 to 40 carbons, preferably an alkylaryl group of 7 to 20 carbons, particularly an alkylaryl group of 7 to 12 carbons.

Examples of the arylalkyl group include arylalkyl groups of 7 to 40 carbons such as benzyl, phenylethyl, phenylpropyl (including isomers of the propyl moiety), phenylbutyl (including isomers of the butyl moiety), phenylpentyl (including isomers of the pentyl moiety) and phenylhexyl (including isomers of the hexyl moiety). Preferred are arylalkyl groups of 7 to 20 carbons, particularly arylalkyl groups of 7 to 12 carbons.

Derivatives of the above-described oxygen-containing organic compounds can also be equally used. Specific examples of such derivatives include, for example, sulfides of a compound selected from the above-described alcohols, carboxylic acids, esters, ethers, ketones, aldehydes and carbonates; halides (fluorides, chlorides, etc.) of such a compound; reaction products of such a compound with sulfuric acid, nitric acid, boric acid, phosphoric acid or an ester or metal salt of such acids; reaction products of such a compound with metal, a metal-containing compound or a amine compound; and the like. Among them, preferred examples are reaction products of one or more compound selected from the above-described alcohols, carboxylic acids, aldehydes and the derivatives thereof with an amine compound (e.g. Mannich reaction products, acylation products, amides, etc.).

Examples of such amine compounds include ammonia, monoamines, diamines and polyamines. More specific examples are ammonia; alkylamines having an alkyl group of 1 to 30 carbons (the alkyl group may be either straight or branched) such as methylamine, ethylamine, propylamine, butylamine, pentylamine, hexylamine, heptylamine, octylamine, nonylamine, decylamine, undecylamine, dodecylamine, tridecylamine, tetradecylamine, pentadecylamine, hexadecylamine, heptadecylamine, octadecylamine, stearylamine, dimethylamine, diethylamine, dipropylamine, dibutylamine, dipentylamine, dihexylamine, diheptylamine, dioctylamine, dinonylamine, didecylamine, diundecylamine, didodecylamine, ditridecylamine, ditetradecylamine, dipentadecylamine, dihexadecylamine, diheptadecylamine, dioctadecylamine, methylethylamine, methylpropylamine, methylbutylamine, ethylpropylamine, ethylbutylamine and propylbutylamine; alkenylamines having an alkenyl group of 2 to 30 carbons (the alkenyl group may be either straight or branched) such as ethenylamine, propenylamine, butenylamine, octenylamine and oleylamine; alkanolamines having an alkanol group of 1 to 30 carbons (the alkanol group may be either straight or branched) such as methanolamine, ethanolamine, propanolamine, butanolamine, pentanolamine, hexanolamine, heptanolamine, octanolamine, nananolamine, methanoletha- nolamine, methanolpropanolamine, methanolbutanolamine, ethanolpropanolamine, ethanolbutanolamine and propanolbutanolamine; alkylenediamines having an alkylene group of 1 to 30 carbons such as methylenediamine, ethylenediamine, propylenediamine and butylenediamine; polyamines such as diethylenetriamine, triethylenetetramine, tetraethylenepentamine and pentaethylenehexamine; the above-described monoamines, diamines and polyamines further having an alkyl or alkenyl group of 8 to 20 carbons, such as undecyldiethylamine, undecyldiethanolamine, dodecyldipropanolamine, oleyldiethanolamine, oleylpropylenediamine and stearyltetraethylenepentamine; heterocyclic compounds such as N-hydroxyethyloleylimidazoline; alkyleneoxide adducts of these compounds; mixtures of these compounds; and the like.

Among these nitrogen compounds, preferred examples include aliphatic amines having an alkyl or alkenyl group of 10 to 20 carbons (they may be either straight or branched) such as decylamine, dodecylamine, tridecylamine, heptadecylamine, octadecylarnine, oleylamine and stearylamine. Further, among these derivatives of the oxygen-containing organic compounds, preferred examples include carboxylic amides of 8 to 20 carbons such as oleic amide.

The above-described oxygen-containing organic compounds exhibit very good low-friction property even when they are used alone (i.e. 100 mass %) in a sliding surface between the hard carbon layer of the sliding member and a counterpart siding member of an arbitrary material. Alternatively, a lubricant composed of such an oxygen-containing organic compound and a lubricant base (e.g. base oil) or an additive added thereto, or a lubricant composed of a medium (including a lubricant base with or without an additive) and such an oxygen-containing organic compound added thereto may be applied to the sliding surface for lubrication.

Specifically, such lubricants are produced by adding an oxygen-containing organic compound to a medium such as mineral oil, synthetic oil, natural fat, diluent oil, grease, wax, a hydrocarbon of 3 to 40 carbons, hydrocarbon solvent, organic solvent other than hydrocarbons, water and mixtures thereof, particularly a medium that is in the form of liquid, grease or wax in the sliding condition or at ordinary temperature. Regarding the content of the oxygen-containing organic compound included in the medium, the lower limit thereof is not particularly limited but is typically 0.001 mass %, preferably 0.05 mass %, more preferably 0.1 mass %, and the content may be more than 3.0 mass %. Further, the upper limit thereof is 100 mass % as described above. However, it is preferably 50 mass %, more preferably 20 mass %, yet more preferably 10 mass %, particularly 5 mass %. Even when the oxygen-containing organic compound is included in a low amount like from 0.1 to 2 mass %, it can exhibit a good low-friction property.

Figure 3:
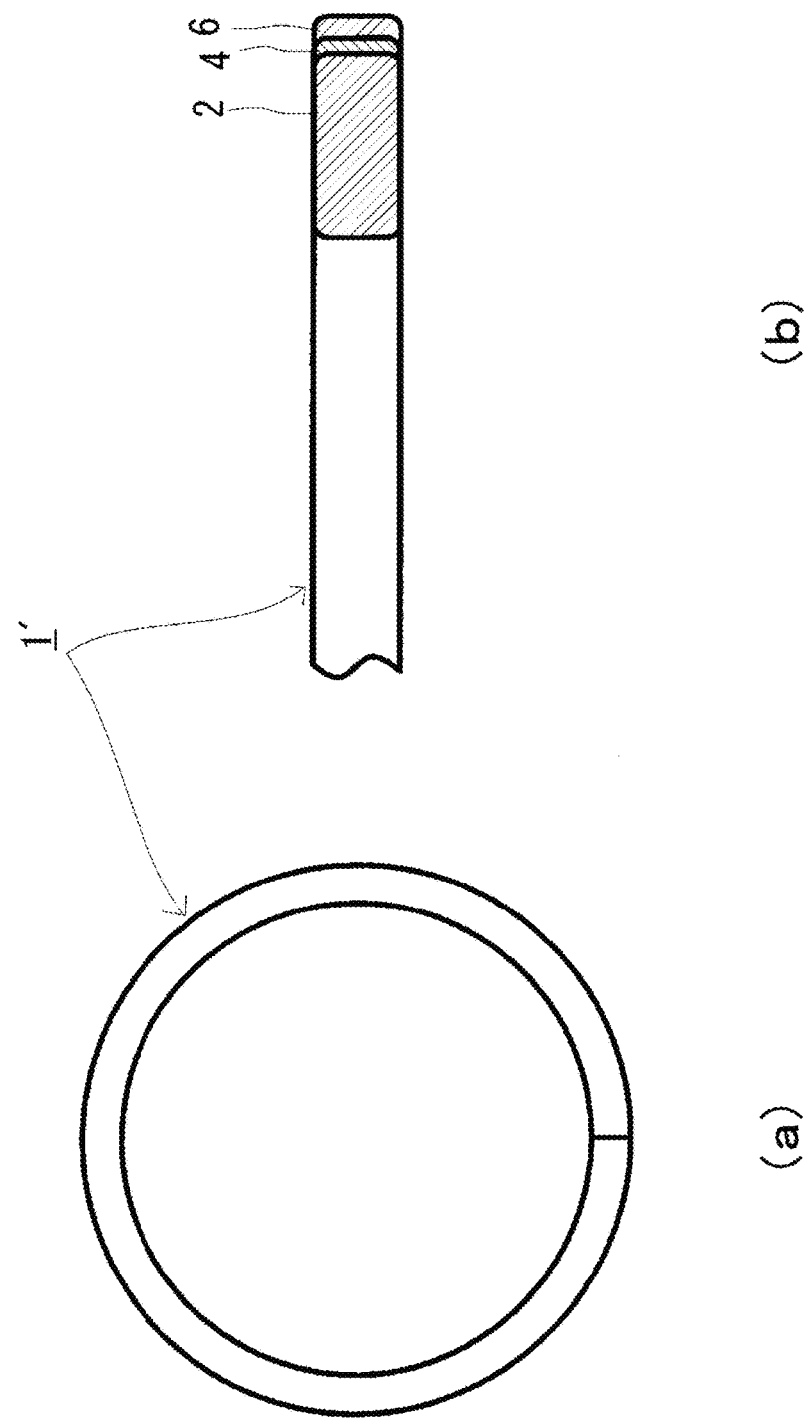
FIG. 3 are (a) a plan view and (b) a partial cross-sectional view of a piston ring, which is an example of a sliding member according to an embodiment of the present invention.

FIG. 3 are (a) a plan view and (b) a partial cross-sectional view taken in the radial direction of a piston ring 1', which is an example of the sliding member 1 in which the predetermined hard chromium plated layer 4 and the predetermined hard carbon layer 6 are formed on the outer peripheral surface (side surface) of the base 2. In this example, the hard chromium plated layer 4 and the hard carbon layer 6 are laminated on the sliding surface of the base 2 in the written order. With this configuration, when the outer peripheral surface (side surface) of the piston ring slides on a counterpart cylinder bore (not shown) and a friction is caused, it can exhibit good peeling resistance and good low-friction property.

Figure 4:
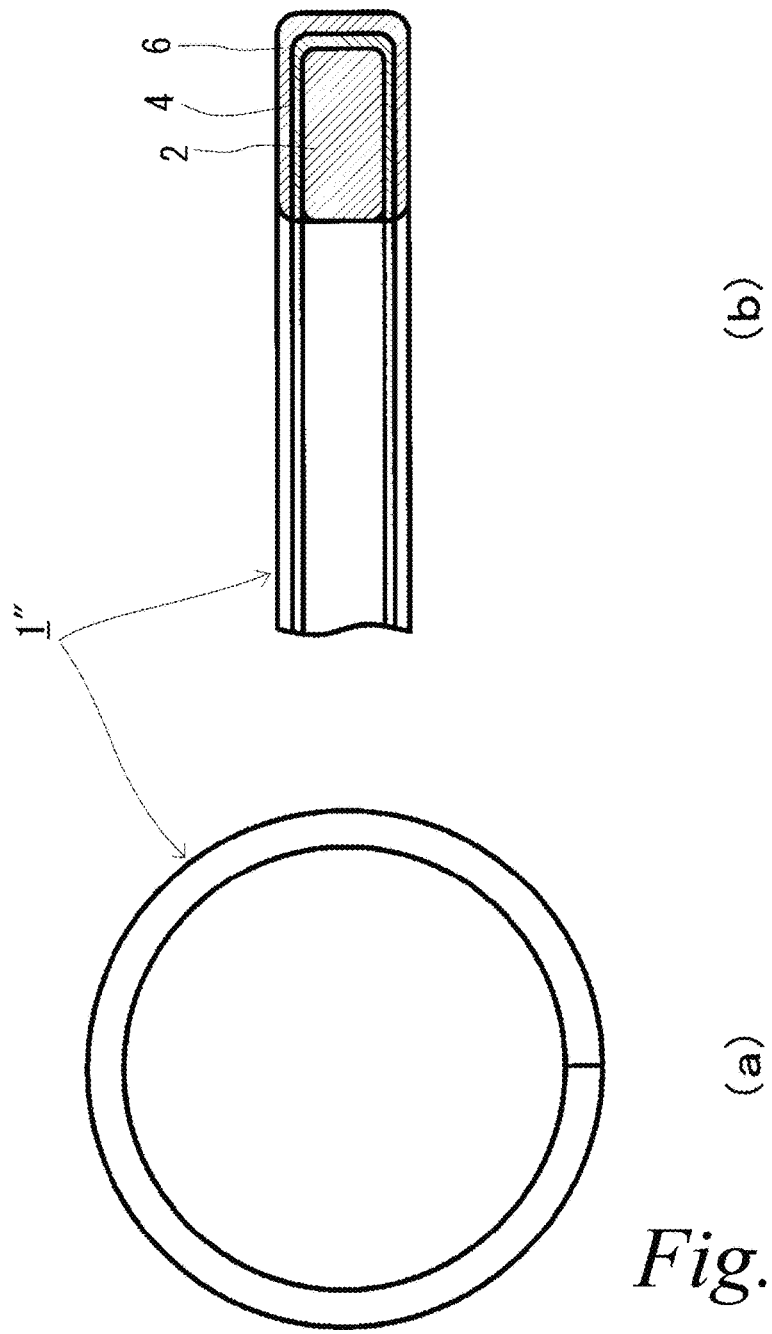
FIG. 4 are (a) a plan view and (b) a partial cross-sectional view of a piston ring, which is another example of a sliding member according to an embodiment of the present invention.
Figure 5:
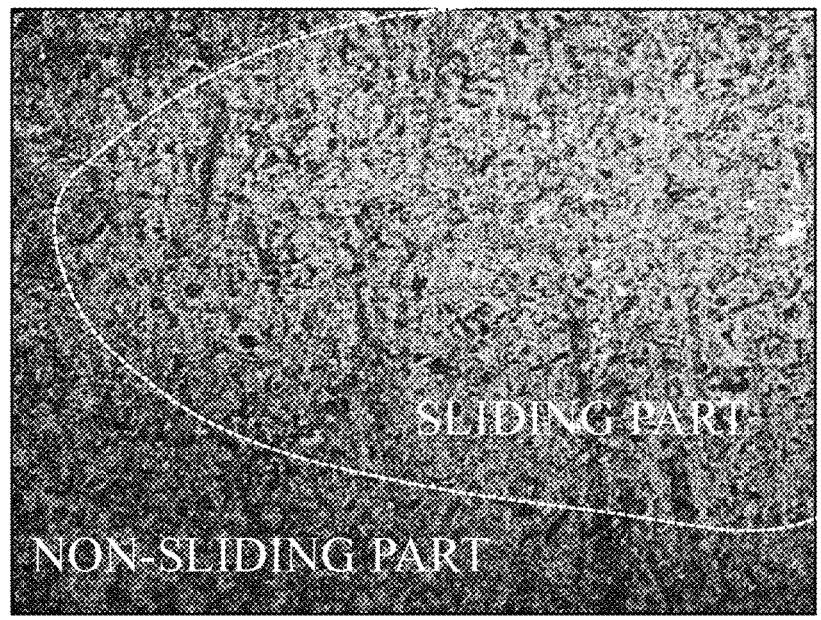
FIG. 5 is a scanning electron micrograph illustrating the surface condition of a sliding member of Example 1.
Figure 6:
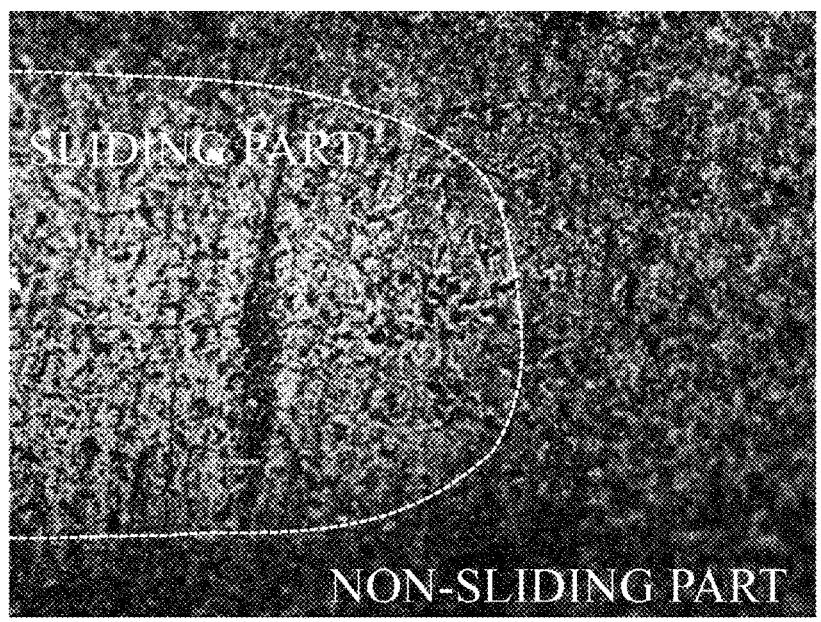
FIG. 6 is a scanning electron micrograph illustrating the surface condition of a sliding member of Example 2.
Figure 7:
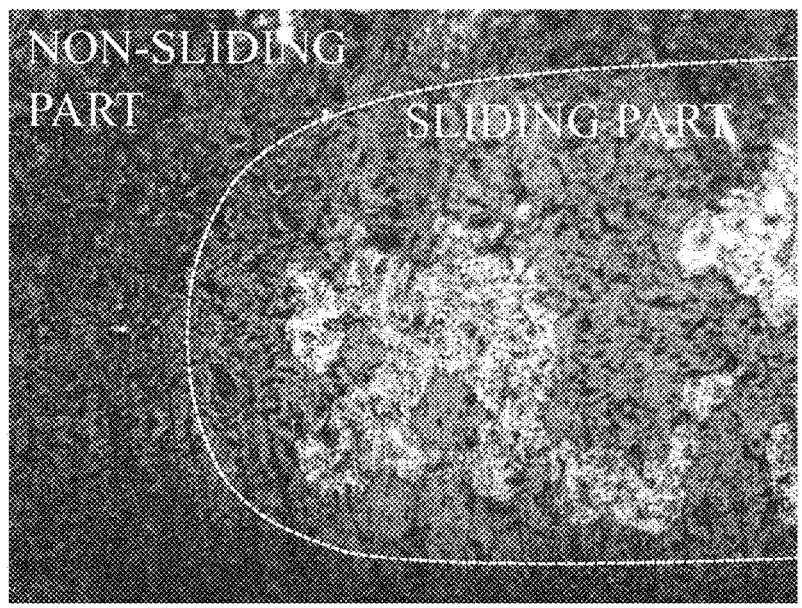
FIG. 7 is a scanning electron micrograph illustrating the surface condition of a sliding member of Comparative Example 1.
Figure 8:
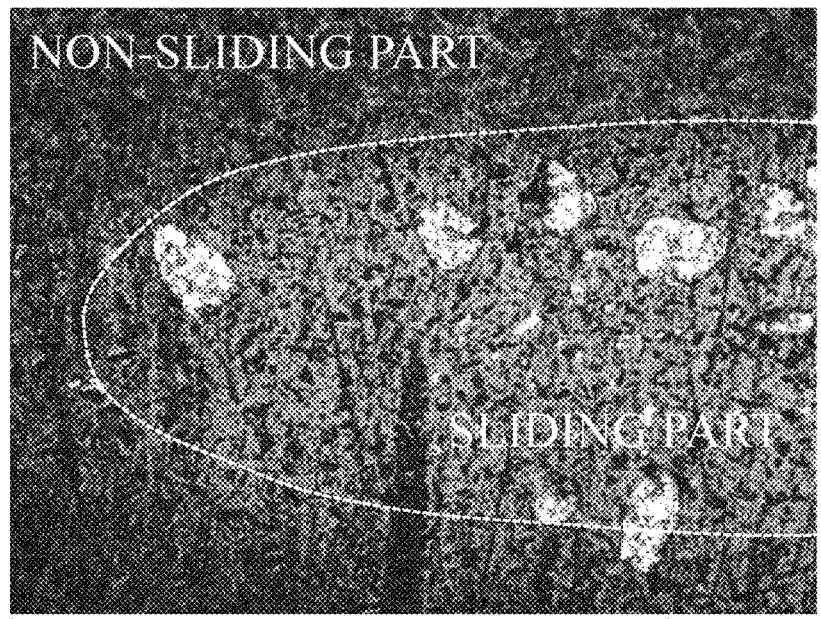
FIG. 8 is a scanning electron micrograph illustrating the surface condition of a sliding member of Comparative Example 3.

FIG. 4 are (a) a plan view and (b) a partial cross sectional view taken in the radial direction of a piston ring 1", which is an example of the sliding member 1 in which the predetermined hard chromium plated layer 4 and the predetermined hard carbon layer 6 are formed on the outer peripheral surface (side surface) and the upper and lower surfaces of the base 2. In this example, the hard chromium plated layer 4 and the hard carbon layer 6 are laminated on the sliding surface and the contact surfaces of the base 2 in the written order. With this configuration, when the outer peripheral surface (side surface) of the piston ring slides on a counterpart cylinder bore (not shown) and a friction is caused, it can exhibit peeling resistance and low-friction property. Further, when the upper or lower surface of the piston ring come in contact with a groove of a piston, which is a counterpart member (not shown), it can exhibit low-friction property and seizing resistance. Although not shown in the figure, it is also possible that the hard chromium plated layer and the hard carbon layer are laminated on the overall surface of the piston ring in the written order. Further, it is also suitable that the hard chromium plated layer and the hard carbon layer are laminated in the written order on the sliding surface of the cylinder bore, which slides against the piston ring.

Next, particularly preferred lubricants used for the sliding member of the present invention will be described in detail.

The lubricant, which is a lubricating oil composition used in combination with the piston ring for an automobile engine, contains lubricant base oil and a component added thereto selected from fatty acid ester type ash-free friction adjusters, aliphatic amine type ash-free friction adjusters, polybutenylsuccinimide, polybutenylsuccinimide derivatives, zinc dithiophosphate and any combination thereof.

The lubricant base oil is not particularly limited, and may be of any type that is generally used as base oil of a lubricating oil composition, such as mineral oil, synthetic oil, fat and a mixture thereof. The lubricant base oil may also be composed of a combination of two or more mineral base oils or two or more synthetic base oils. The mixing ratio of two or more base oils of the mixture is not particularly limited and may be arbitrarily selected.

Specific examples of mineral oils that can be used include paraffin oils and naphthene oils obtained by distilling crude oil at atmospheric pressure and a reduced pressure and then further purifying the obtained lubricating oil distillate by a suitable combination of purification treatments such as solvent deasphalting, solvent extraction, hydrocracking, solvent dewaxing, hydropurification, sulfuric acid cleaning and gray clay treatment, as well as normal paraffins, and the like. Among them, typical examples are mineral oils produced by solvent purification and hydropurification. However, it is more preferred to use isoparaffins that are produced by a high hydrocracking process or GTL wax (gas-to-liquid wax) isomerization, which can further reduce the aromatic component.

Specific examples of the synthetic oil include poly-α-olefins (e.g. 1-octen oligomer, 1-decene oligomer, ethylene-propylene oligomer, etc.), hydrogenated poly-α-olefins, isobutene oligomer, hydrogenated isobutene oligomer, isoparaffin, alkylbenzenes, alkylnaphthalenes, diesters (e.g. ditridecyl glutarate, dioctyl adipate, diisodecyl adipate, ditridecyl adipate, dioctyl sebacate, etc.) polyol esters (e.g. trimethylolpropane esters such as trimethylolpropane caprylate, trimethylolpropane pelargonate and trimethylolpropane isostearate; and pentaerythritol esters such as pentaerythritol 2-ethylhexanoate and pentaerythritol pelargonate), polyoxyalkylene glycols, dialkyldiphenyl ethers, polyphenyl ether, and the like. Among them, preferred examples are poly-α-olefins such as 1-octene oligomer and 1-decene oligomer, and the hydrogenated products thereof. Further, among these esters, polyol esters are particularly preferred. Typically, such synthetic oils include gear oils, automobile engine oils, transmission oils, turbine oils and spindle oils, and the like.

The sulfur content in the lubricant base oil is not particularly limited, but is preferably equal to or less than 0.2 mass %, more preferably equal to or less than 0.1 mass %, yet more preferably equal to or less than 0.05 mass % with respect to the total amount of the lubricant base oil. Since hydropurified mineral oil and synthetic base oil contain 0.005 mass % or less of sulfur or are substantially sulfur-free (5 ppm or less), they are preferably used as the base oil.

The aromatic content in the lubricant base oil is not particularly limited. However, in order to maintain the low-friction property of the lubricating oil composition for a long time, it is preferably equal to or less than 15 mass %, more preferably equal to or less than 10 mass %, yet more preferably equal to or less than 5 mass %. That is, it is not preferred that the total aromatic content in the lubricant base oil is greater than 15 mass %, since it results in poor oxidation stability. As used herein, the term "total aromatic content" means aromatic fraction content measured according to ASTM D2549. The aromatic fraction typically contains alkylbenzenes, alkylnaphthalenes, anthracene, phenanthrene, alkylates of these compounds, condensates of four or more benzene rings, heteroaromatic compounds such as pyridines, quinolines, phenols and naphthols, and the like.

The kinetic viscosity of the lubricant base oil is not particularly limited, either. However, when it is used for the lubricating oil composition, the kinetic viscosity at 100° C. is preferably equal to or greater than 2 $mm^2/s$, more preferably equal to or greater than 3 $mm^2/s$. Further, the kinetic viscosity at 100° C. is preferably equal to or less than 20 $mm^2/s$, more preferably equal to or less than 10 $mm^2/s$, particularly equal to or less than 8 $mm^2/s$. It is not preferred that the kinetic viscosity at 100° C. is less than 2 $mm^2/s$, since it may result in insufficient wear resistance and poor evaporation property. It is not preferred that the kinetic viscosity is greater than 20 $mm^2/s$, since it may result in a difficulty in exhibiting low-friction property and poor low-temperature performance Any mixture of two or more base oil selected from the above-described base oil may also be used. As long as the kinetic viscosity at 100° C. is within the above-described preferred range, individual base oils may solely have a kinetic viscosity beyond the above-described range. When the lubricant base oil has a kinetic viscosity at 100° C. of 2 $mm^2/s$ or more, it becomes possible to obtain the composition that can form adequate oil film, has good lubricity and also has low evaporation loss of base oil in a high-temperature condition. When the lubricant base oil has a kinetic viscosity at 100° C. of 20 $mm^2/s$ or less, it becomes possible to obtain the composition that exhibits further low friction at a lubrication point due to its reduced flow resistance.

The viscosity index of the lubricant base oil is not particularly limited, but is preferably equal to or more than 80. When it is used for the lubricating oil composition, the viscosity index is preferably equal to or greater than 100, more preferably equal to or greater than 120 or may be from 140 to 250. When the lubricant base oil with high viscosity index is used, it becomes possible to obtain the composition that has good friction reducing effect as well as low oil consumption and good low-temperature viscosity profile.

Examples of fatty acid ester type ash-free friction adjusters and/or aliphatic amine type ash-free friction adjusters that can be used include fatty acid esters and aliphatic amine compounds having a straight or branched hydrocarbon group of 6 to 30 carbons, preferably 8 to 24 carbons, particularly 10 to 20 carbons, and any combination thereof. When the number of carbon is out of the range of 6 to 30, it may result in insufficient friction reducing effect.

Specific examples of such straight or branched hydrocarbon groups of 6 to 30 carbons include alkyl groups such as hexyl, heptyl, octyl, nonyl, decyl, undecyl, dodecyl, tridecyl, tetradecyl, pentadecyl, hexadecyl, heptadecyl, octadecyl, nonadecyl, icosyl, henicosyl, docosyl, tricosyl, tetracosyl, pentacosyl, hexacosyl, heptacosyl, octacosyl, nonacosyl and triacontyl; alkenyl groups such as hexenyl, heptenyl, octenyl, nonenyl, decenyl, undecenyl, dodecenyl, tridecenyl, tetradecenyl, pentadecenyl, hexadecenyl, heptadecenyl, octadecenyl, nonadecenyl, icosenyl, heneicosenyl, docosenyl, tricosenyl, tetracosenyl, pentacosenyl, hexacosenyl, heptacosenyl, octacosenyl and nocosenyl and triacontenyl; and the like. The above-described alkyl and alkenyl groups include all possible respective straight and branched structures, and the double bond of the alkenyl groups may be at any position.

Examples of the fatty acid esters include esters of a fatty acid having the above-described hydrocarbon group of 6 to 30 carbons and a mono- or polyhydric aliphatic alcohol. Specifically, particularly preferred examples include glycerin monooleate, glycerin dioleate, sorbitan monooleate, sorbitan dioleate and the like.

Examples of the aliphatic amine compounds include aliphatic monoamines and the alkylene oxide adducts thereof, aliphatic polyamines, imidazoline compounds and the derivatives thereof, and the like. Specific examples include aliphatic amine compounds such as laurylamine, lauryldiethylamine, lauryldiethanolamine, dodecyldipropanolamine, palmitylamine, stearylamine, stearyltetraethylenepentamine, oleylamine, oleylpropylenediamine, oleyldiethanolamine and N-hydroxyethyloleylimidazoline; aminealkyleneoxide adducts (e.g. N,N-dipolyoxyalkylene-N-alkyl (or alkenyl) (6 to 28 carbons)) of these aliphatic amine compounds; so-called acid-modified compounds of these aliphatic amine compounds, in which the residual amino and/or imino group is fully or partly neutralized or amidated by a reaction with a monocarboxylic acid (fatty acid etc.) of 2 to 30 carbons or a polycarboxylic acid of 2 to 30 carbons such as oxalic acid, phthalic acid, trimellitic acid and pyromellitic acid. Suitable examples are N,N-dipolyoxyethylene-N-oleylamine and the like.

The content of the fatty acid ester type ash-free friction adjuster and/or the aliphatic amine type ash-free friction adjuster in the lubricating oil composition is not particularly limited, but is preferably from 0.05 mass % to 3.0 mass %, more preferably from 0.1 mass % to 2.0 mass %, particularly from 0.5 mass % to 1.4 mass % with respect to the total amount of the composition. The content less than 0.05 mass % is unfavorable since the friction reducing effect is likely to be decreased. Further, the content greater than 3.0 mass % is unfavorable since the solubility to lubricating oil and the storage stability are seriously deteriorated, which are likely to cause a precipitate.

Examples of the above-described polybutenylsuccinimides include the compounds of the following formulae (VIII) and (IX).

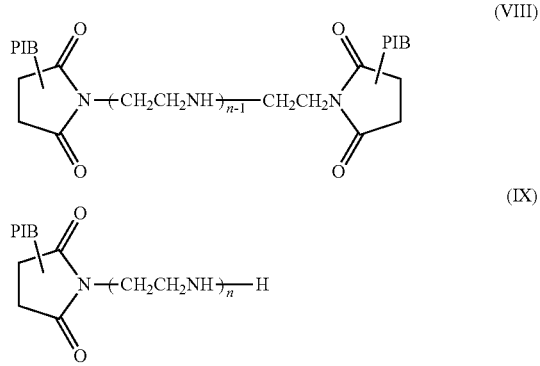

In the formulae, PIB is a polybutenyl group, which is derived from a polybutene having a number average molecular weight of from 900 to 3500, desirably from 1000 to 2000 obtained by polymerizing high-purity isobutene or a mixture of 1-butene and isobutene using a fluoboric catalyst or an aluminum chloride catalyst. The number average molecular weight of less than 900 is unfavorable since the cleaning effect is likely to be deteriorated. Further, the number average molecular weight of greater than 3500 is unfavorable since the low-temperature fluidity is likely to be deteriorated. Further, in the formulae, n is an integer of 1 to 5, more preferably 2 to 4 in terms of achieving good cleaning property. It is also preferable that the polybutene is purified beforehand by adsorption or sufficient washing with water so that the trace amount of residual fluorine or chlorine, which is derived from the catalyst used in the production process, is removed to a concentration of 50 mass ppm or less, preferably 10 mass ppm or less, particularly 1 mass ppm or less.

The production method of the polybutenylsuccinimides is not particularly limited. For example, they may be produced by reacting a chloride of the above-described polybutene or the purified polybutene, from which chlorine and fluorine is sufficiently removed, with maleic acid anhydride at a temperature of 100° C. to 200° C. yielding a polybutenyl succinic acid and then reacting the polybutenyl succinic acid with a polyamine such as diethylenetriamine, triethylenetetramine, tetraethylenepentamine and pentaethylenehexamine.

Examples of the polybutenylsuccinimide derivatives include so-called boron-modified or acid-modified compounds obtained by reacting a compound of the above formula (VIII) or (XI) with a boron compound or an oxygen-containing organic compound so that the residual amino and/or imino group is partly or fully neutralized or amidated. Among them, boron-containing polybutenylsuccinimide, particularly boron-containing bispolybuthenylsuccinimide is currently the most preferred.

Examples of the boron compound include boric acids, borates, and boric acid esters. Specific examples of such boric acids include orthoboric acid, metaboric acid, tetraboric acid and the like. Examples of such borates include ammonium salts and the like. Specifically, preferred examples include ammonium borates such as ammonium metaborate, ammonium tetraborate, ammonium pentaborate and ammonium octaborate. Examples of such boric acid esters include esters of boric acid and an alkyl alcohol of preferably 1 to 6 carbons. To be more specific, preferred examples include monomethyl borate, dimethyl borate, trimethyl borate, monoethyl borate, diethyl borate, triethyl borate, monopropyl borate, dipropyl borate, tripropyl borate, monobutyl borate, dibutyl borate, tributyl borate and the like. The mass ratio "B/N" of boron content B to nitrogen content N in the boron-containing polybutenylsuccinimide is typically from 0.1 to 3, preferably from 0.2 to 1.

Specific examples of the oxygen-containing organic compound include monocarboxylic acids of 1 to 30 carbons such as formic acid, acetic acid, glycolic acid, propionic acid, lactic acid, butyric acid, valeic acid, caproic acid, enanthic acid, caprylic acid, pelargonic acid, capric acid, undecylic acid, lauric acid, tridecanic acid, myristic acid, pentadecanic acid, palmitic acid, margaric acid, stearic acid, oleic acid, nonadecanic acid and eicosanic acid; polycarboxylic acids of 2 to 30 carbons such as oxalic acid, phthalic acid, trimellitic acid and pyromellitic acid; anhydrides and ester compounds of these compounds, alkylene oxides of 2 to 6 carbons, hydroxy(poly)oxyalkylenecarbonates, and the like.

In the lubricating oil composition, the content of the polybutenylsuccinimide and/or the polybutenylsuccinimide derivative is not particularly limited, but is preferably from 0.1 mass % to 15 mass %, more preferably from 1.0 mass % to 12 mass %. When the content is less than 0.1 mass %, the cleaning effect may be poor. When the content is greater than 15 mass %, it is difficult to further increase the cleaning effect, and the demulsification effect is likely to be deteriorated.

Further, it is preferred that the lubricating oil composition contains a zinc dithiophosphate of the following formula (X).

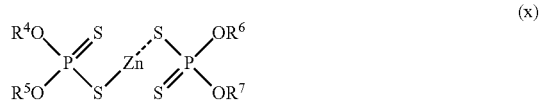

In the formula (X), $R^4$, $R^5$, $R^6$ and $R^7$ are each independently a hydrocarbon group of 1 to 24 carbons. Such hydrocarbon groups include straight or branched alkyl groups of 1 to 24 carbons, straight or branched alkenyl groups of 3 to 24 carbons, cycloalkyl or straight or branched alkylcycloalkyl groups of 5 to 13 carbons, aryl or straight or branched alkylaryl groups of 6 to 18 carbons, arylalkyl groups of 7 to 19 carbons and the like. The alkyl or alkenyl groups may be any of primary, secondary and tertiary groups.

Specific examples of $R^4$, $R^5$, $R^6$ and $R^7$ include alkyl groups such as methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, icosyl, henicosyl, docosyl, tricosyl and tetracosyl; alkenyl groups such as propenyl, isopropenyl, butenyl, butadienyl, pentenyl, hexenyl, heptenyl, octenyl, nonenyl, decenyl, undecenyl, dodecenyl, tridecenyl, tetradecenyl, pentadecenyl, hexadecenyl, heptadecenyl, octadecenyl (e.g. oleyl, etc.), nonadecenyl, icosenyl, heneicosenyl, docosenyl, tricosenyl and tetracosenyl; cycloalkyl groups such as cyclopentyl, cyclohexyl and cycloheptyl; alkylcycloalkyl groups such as methylcyclopentyl, dimethylcyclopentyl, ethylcyclopentyl, propylcyclopentyl, ethylmethylcyclopentyl, trimethylcyclopentyl, diethylcyclopentyl, ethyldimethylcyclopentyl, propylmethylcyclopentyl, propylethylcyclopentyl, di-propylcyclopentyl, propylethylmethylcyclopentyl, methylcyclohexyl, dimethylcyclohexyl, ethylcyclohexyl, propylcyclohexyl, ethylmethylcyclohexyl, trimethylcyclohexyl, diethylcyclohexyl, ethyldimethylcyclohexyl, propylmethylcyclohexyl, propylethylcyclohexyl, di-propylcyclohexyl, propylethylmethylcyclohexyl, methylcycloheptyl, dimethylcycloheptyl, ethylcycloheptyl, propylcycloheptyl, ethylmethylcycloheptyl, trimethylcycloheptyl, diethylcycloheptyl, ethyldimethylcycloheptyl, propylmethylcycloheptyl, propylethylcycloheptyl, di-propylcycloheptyl and propylethylmethylcycloheptyl; aryl groups such as phenyl and naphthyl; alkylaryl groups such as tolyl, xylyl, ethylphenyl, propylphenyl, ethylmethylphenyl, trimethylphenyl, butylphenyl, propylmethylphenyl, diethylphenyl, ethyldimethylphenyl, tetramethylphenyl, pentylphenyl, hexylphenyl, heptylphenyl, octylphenyl, nonylphenyl, decylphenyl, undecylphenyl and dodecylphenyl; arylalkyl groups such as benzyl, methylbenzyl, dimetnylbenzyl, phenethyl, methylphenethyl and dimethylphenethyl; and the like. These hydrocarbon groups that can be $R^4$, $R^5$, $R^6$ or $R^7$ include all possible straight and branched structures. Further, the double bond of the alkenyl groups may be at any position. The alkyl group on the cycloalkyl groups, the alkyl group on the aryl groups, and the aryl group on the alkyl groups may be bound at any position. Among these hydrocarbon groups, straight or branched alkyl groups of 1 to 18 carbons, and aryl or straight or branched alkylaryl groups of 6 to 18 carbons are particularly preferred.

Preferred specific examples of the zinc dithiophosphate include zinc diisopropyl dithiophosphate, zinc diisobutyl dithiophosphate, zinc di-sec-butyl dithiophosphate, zinc di-sec-pentyl dithiophosphate, zinc di-n-hexyl dithiophosphate, zinc di-sec-hexyl dithiophosphate, zinc dioctyl dithiophosphate, zinc di-2-ethylhexyl dithiophosphate, zinc di-n-decyl dithiophosphate, zinc di-n-dodecyl dithiophosphate, zinc diisotridecyl dithiophosphate, and mixtures composed of any combination thereof, and the like.

The content of the zinc dithiophosphate is not particularly limited. However, in terms of achieving higher friction reducing effect, the content is preferably equal to or less than 0.1 mass %, more preferably equal to or less than 0.06 mass % in phosphor-element equivalent with respect to the total amount of the composition. It is particularly preferred that no zinc dithiophosphate is contained. When the content of the zinc dithiophosphate is greater than 0.1 mass % in phosphor-element equivalent with respect to the total amount of the composition, it may inhibit the friction reducing effect of the above-described fatty acid ester type ash-free friction adjuster and aliphatic amine type ash-free friction adjuster in a sliding surface between the member with the hard carbon film coating and a counterpart sliding member of an arbitrary material.

The zinc dithiophosphate may be produced by any conventional method, and the production method is not particularly limited. Specifically, it can be synthesized by reacting an alcohol or phenol having hydrocarbon groups corresponding to $R^4$, $R^5$, $R^6$ and $R^7$ with diphosphorus pentoxide ($P_2O_5$) to yield a dithiophosphoric acid, and then neutralizing it with zinc oxide. It should be understood that the structure of the zinc dithiophosphate differs depending on the alcohol material used. A mixture of two or more zinc dithiophosphates of the formula (X) in an arbitrary mixing ratio may also be used.

As described above, the lubricating oil composition exhibits remarkably high low-friction property when it is used in a sliding surface between the sliding member with the hard carbon layer coating and a counterpart sliding member of an arbitrary material. In order to enhance the performance required for internal combustion engine lubricating oil compositions, a metal cleaner, an antioxidant, a viscosity index enhancer, another ash-free friction adjuster, another ash-free dispersant, an anti-wear agent or extreme pressure agent, a rust inhibitor, a non-ionic surfactant, a demulsifier, a metal deactivator, an antifoam agent or the like may be added alone or in combination.

Metal cleaners that can be used include any compound that is generally used as a metal cleaner for lubricating oil. For example, sulfonates, phenates, salicylates, naphthenates and the like of alkaline metals or alkaline earth metals may be used alone or in combination. Examples of such alkali metals include sodium (Na), potassium (K) and the like, and examples of such alkali earth metals include calcium (Ca), magnesium (Mg) and the like. Further, preferred specific examples include sulfonates, phenates, and salicylates of Ca or Mg. The total base value of the metal cleaner and the amount thereof added are suitably selected according to the required performance of the lubricating oil. The total base value is typically from 0 to 500 mg KOH/g, preferably from 150 to 400 mg KOH/g measured by the perchloric acid method, and the amount added is typically from 0.1 mass % to 10 mass % with respect to the total amount of the composition.

Antioxidants that can be used include any compound that is generally used as an antioxidant for lubricating oil. For example, examples of such antioxidants include phenol antioxidants such as 4,4'-methylenebis(2,6-di-tert-butylphenol), octadecyl-3-(3,5-di-tert-butyl-4-hydroxyphenyl)propionate and octadecyl-3-(3-methyl-5-tert-butyl-4-hydroxyphenyl)propionate; amine antioxidants such as phenyl-α-naphthylamine, alkylphenyl-α-naphtylamines and alkyldiphenylamines; mixtures composed of any combination of thereof; and the like. The amount of the antioxidant added is typically from 0.01 mass % to 5 mass % with respect to the total amount of the composition.

Specific examples of the viscosity index enhancer include so-called non-dispersed viscosity index enhancers such as copolymers of one or more monomer selected from various methacrylates and the hydrogenated products thereof, so-called dispersed viscosity index enhancers that are obtained by further copolymerizing a monomer selected from various methacrylates having a nitrogen compound, and the like. Further, specific examples of the viscosity index enhancer also include non-dispersed or dispersed ethylene-α-olefin copolymers (where the α-olefin is propylene, 1-butene, 1-pentene and the like) and the hydrogenated products thereof, polyisobutylene and the hydrogenated product thereof, styrene-diene hydrogenated copolymers, styrene-maleic anhydride ester copolymers, polyalkylstyrene and the like. It is required to select the molecular weight of these viscosity index enhancers in view of the shear stability. Specifically, among these viscosity index enhancers, the average number molecular weight of dispersed or non-dispersed polymethacrylates is from 5000 to 1000000, preferably from 100000 to 800000, the number average molecular weight of polyisobutylene and the hydrogenated product thereof is from 800 to 5000, the number average molecular weight of ethylene-α-olefin copolymers and the hydrogenated products thereof is from 800 to 300000, preferably from 10000 to 200000. Such viscosity index enhancers may be added alone or in combination of plural types, and the content is typically from 0.1 mass % to 40.0 mass % with respect to the lubricating oil composition.

Examples of another ash-free friction adjuster include ash-free friction adjusters such as borates, higher alcohols and fatty acid ethers; metal friction adjusters such as molybdenum dithiophosphate, molybdenum dithiocarbamate and molybdenum disulfide; and the like.

Examples of another ash-free dispersant include polybutenylbenzylamine and polybutenylamine having a polybutenyl group with a number average molecular weight of from 900 to 3500, polybutenylsuccinimide having a polybutenyl group with a number average molecular weight less than 900, the derivatives thereof and the like.

Examples of the anti-wear agent and the extreme pressure agent include disulfides, sulfurized greases, sulfurized olefins, phosphates having one to three hydrocarbon group of 2 to 20 carbons, thiophosphates, phosphites, thiophosphites, the amine salts thereof, and the like.

Examples of the rust inhibitor include alkylbenzene sulfonates, dinonylnaphthalene sulfonate, alkyenylsuccinates, polyol esters and the like.

Examples of the non-ionic surfactant or the demulsifier include polyalkylene glycol non-ionic surfactants such as polyoxyethylene alkylethers, polyoxyethylene alkylphenylethers and polyoxyethylene alkylnaphthylethers. Further, examples of the metal deactivator include imidazoline, pyrimidine derivatives, thiadiazoles, benzotriazoles, thiadiazoles and the like.

Examples of the antifoam agent include silicone, fluorosilicone, fluoroalkylethers and the like.

When such additives are added to the lubricating oil composition, the content thereof is suitably selected within the range of 0.01 mass % to 5 mass % for the another friction adjuster, another ash-free dispersant, anti-wear agents, extreme pressure agents, and demulsifiers, within the range of 0.005 mass % to 1 mass % for metal deactivators, and within the range of 0.0005 to 1 mass % for antifoam agents, with respect to the composition Hereinafter, the present invention will be described in further detail with examples and comparative examples.

Reference 1

On the surface of a piston ring base for an automobile engine, a hard chromium plated layer is formed to a thickness of approximately 100 μm by electrolytic plating. Then, the piston ring base with the hard chromium plated layer formed thereon is heated at 250° C. in the air. Thereafter, a hydrogen-free hard carbon layer is formed on the hard chromium plated layer of the piston ring base by PVD. The piston ring of this example was thus obtained.

After forming the hard chromium plated layer, which was a midway step of the process, the hydrogen concentration of the hard chromium plated layer was measured by using another piston ring, which was prepared by forming the hard chromium plated layer in the same batch and heating it in the same condition as the production process of the above-described piston ring. To measure the hydrogen concentration, a sample was cut to a suitable size and placed in a crucible. The sample was heated to approximately 1000° C., and the generated gas was analyzed. The carrier gas used was argon (Ar), and the hydrogen concentration in discharged gas was measured, and the amount of hydrogen was calculated from the flow rate of the carrier gas. At the same time, similar measurement was performed for a sample without the hard chromium plated layer. By subtracting the measured value as a background value, the amount of hydrogen contained only in the hard chromium plated layer was calculated. As a result, the hydrogen concentration in the hard chromium plated layer was 148 ppm.

Example 2

A piston ring of this example was prepared in the same manner as Reference 1 except that the heating temperature was 280° C. In the process, the hydrogen concentration of the hard chromium plated layer was also measured by the same process.

Example 3

A piston ring of this example was prepared in the same manner as Reference 1 except that the heating temperature was 300° C. In the process, the hydrogen concentration of the hard chromium plated layer was also measured by the same process.

Example 4

A piston ring of this example was prepared in the same manner as Reference 1 except that the heating temperature was 350° C. In the process, the hydrogen concentration of the hard chromium plated layer was also measured by the same process.

(Reference 5)

A piston ring of this example was prepared in the same manner as Reference 1 except that the heating temperature was 400° C. In the process, the hydrogen concentration of the hard chromium plated layer was also measured by the same process.

Comparative Example 1

A piston ring of this example was prepared in the same manner as Reference 1 except that the sample was not heated. In the process, the hydrogen concentration of the hard chromium plated layer was also measured by the same process.

Comparative Example 2

A piston ring of this example was prepared in the same manner as Reference 1 except that the heating temperature was 100° C. In the process, the hydrogen concentration of the hard chromium plated layer was also measured by the same process.

Comparative Example 3

A piston ring of this example was prepared in the same manner as Reference 1 except that the heating temperature was 200° C. In the process, the hydrogen concentration of the hard chromium plated layer was also measured by the same process.

The configuration of the above-described examples and Comparative Examples are shown in Table 1.

TABLE 1

|  | Heating Temperature (° C.) | Hydrogen Concentration (ppm) | Peeling, Test Result | General Evaluation Result |
| --- | --- | --- | --- | --- |
| Reference 1 | 250 | 148 | minute peeling | B |
| Example 2 | 280 | 105 | no peeling | A |

TABLE 1-continued

| | Heating Temperature (° C.) | Hydrogen Concentration (ppm) | Peeling, Test Result | General Evaluation Result |
|---|---|---|---|---|
| Example 3 | 300 | 66 | no peeling | A |
| Example 4 | 350 | 28 | no peeling | A |
| Reference 5 | 400 | 9 | no peeling | B |
| Comparative Example 1 | no treatment | 819 | large peeling | C |
| Comparative Example 2 | 100 | 762 | large peeling | C |
| Comparative Example 3 | 200 | 319 | large peeling | C |

(Reciprocating Sliding Test)

A reciprocating sliding test was performed for 30 minutes under the conditions of an average sliding speed of 0.3 m/s and a pressing load of 100 N for each piston ring of the above-described Examples and Comparative Examples. Engine oil was used as a lubricant. The surface condition of the hard carbon layers were observed under a scanning electron microscope. The results are also shown in Table 1. Further, general evaluation results are also shown in Table 1. In Table 1, "A" represents practically acceptable and very good, "B" refers to practically acceptable and good, and "C" represents practically unacceptable and not good.

FIG. 5, FIG. 6, FIG. 7 and FIG. 8 are scanning electron micrographs illustrating the surface condition of the piston rings, which are the sliding members of Reference 1, Example 2, Comparative Example 1 and Comparative Example 3 respectively.

In the piston ring of Reference 1, very minute peeling was observed in the hard carbon layer of the sliding surface, which was however acceptable for practical use. It was found that the hard carbon layer is strongly adhered, i.e. has high peeling resistance (see FIG. 5).

In the piston rings of Example 2 to Example 4, no peeling was observed in the hard carbon layers of the sliding surface. It was found that the hard carbon layers are strongly adhered, i.e. has high peeling resistance (see FIG. 6).

In the piston ring of Reference 5, no peeling was observed in the hard carbon layer of the sliding surface. It was found that the hard carbon layer is strongly adhered, i.e. has high peeling resistance. However, the hardness of the hard chromium plated layer was decreased by 200 HV or more compared to the untreated condition. It is presumed that microcracks present in the hard chromium plating were grown, and the original wear resistance of the hard chromium plated layer was thereby significantly decreased.

In the piston rings of Comparative Example 1 to Comparative Example 3, large peeling was observed in the hard carbon layers of the sliding surfaces. It was found that the hard carbon layers are not adequately adhered, and the peeling resistance is not sufficient (see FIG. 7 and FIG. 8).

While the present invention was described with a few embodiments and Examples, the present invention is not limited thereto, and various modifications can be made within the scope of the gist of the present invention.

That is, the above-described embodiments and Examples are piston rings, which are an example of the sliding member. However, the present invention is not limited thereto, and the present invention encompasses other sliding members such as those of a valve train or an intake and exhaust system and those of a power drive. Specific examples of such sliding members of a valve train or an intake and exhaust system include piston pins, pistons (or piston skirts (a piston skirt means a skirt portion of a piston), cylinders (or cylinder liners), plungers, check valves, valve guides, connection rods, bushes, crank shafts, cum lobes, cum journals, locker arms, valve springs, shims, lifters, rotating vanes of vane pumps, housings of vane pumps, timing chains, sprockets, chain guides (or chain guide shoes), chain tensioners (or chain tensioner shoes) and the like. Specific examples of such sliding members of a power drive includes, for example, gears, chains, belts, roller bearings, slide bearings, oil pumps etc. of automatic transmissions, continuously variable transmissions, manual transmissions, final drive gears, and the like.

The sliding member of the present invention is not limited to the above-described members but can also be used in sliding conditions in the presence of grease, biodiesel fuel, diesel fuel, gas-to-liquid (GTL) fuel, high-octane gasoline or the like.

The entire disclosure of Japanese Patent Application No. 2013-013290 filed on Jan. 28, 2013 is incorporated herein by reference.

REFERENCE SIGNS LIST

1 Sliding member
1', 1" Piston ring
2 Base
4 Hard chromium plated layer
6 Hard carbon layer

The invention claimed is:

1. A method for producing a sliding member, the sliding member comprising:
   a base,
   a chromium-based hard chromium plated layer formed on a surface of the base, and
   a hard carbon layer mainly composed of carbon element, formed on the hard chromium plated layer,
      wherein a hydrogen concentration of the hard chromium plated layer is from 10 to 140 mass ppm;
   comprising:
   heating the surface of the base, on which the chromium-based hard chromium plated layer has been formed, at a temperature of from 260° C. to less than 400° C., so that the hydrogen concentration of the hard chromium plated layer is from 10 to 140 mass ppm, and thereafter forming the hard carbon layer mainly composed of carbon element on the hard chromium plated layer.

2. The method according to claim 1, wherein a hydrogen concentration of the hard carbon layer is equal to or less than 40 at %.

3. The method according to claim 1,
   wherein a hydrogen concentration of an outermost layer of the hard carbon layer is greater than 0 at % and less than or equal to 2 at %, or
the outermost layer of the hard carbon layer contains no hydrogen.

4. The method according to claim 1,
   wherein the sliding member is a piston ring, and
the hard carbon layer is formed at least on an outer peripheral surface of the piston ring.

5. The method according to claim 3,
   wherein the sliding member is a piston ring, and
the hard carbon layer is formed at least on an outer peripheral surface of the piston ring.

6. The method according to claim 2,
   wherein a hydrogen concentration of an outermost layer of the hard carbon layer is greater than 0 at % and less than or equal to 2 at %, or the outermost layer of the hard carbon layer contains no hydrogen.

7. The method according to claim 2,
wherein the sliding member is a piston ring, and the hard carbon layer is formed at least on an outer peripheral surface of the piston ring.

8. The method according to claim 6,
wherein the sliding member is a piston ring, and the hard carbon layer is formed at least on an outer peripheral surface of the piston ring.

* * * * *